United States Patent
Loomis et al.

(10) Patent No.: US 10,072,129 B2
(45) Date of Patent: Sep. 11, 2018

(54) STIMULI-RESPONSIVE POLYMER COMPOSITES

(71) Applicant: University of Louisville Research Foundation, Inc., Louisville, KY (US)

(72) Inventors: James Loomis, Melrose, MA (US); Balaji Panchapakesan, Northborough, MA (US)

(73) Assignee: UNIVERSITY OF LOUISVILLE RESEARCH FOUNDATION, INC., Louisville, KY (US)

( * ) Notice: Subject to any disclaimer, the term of this patent is extended or adjusted under 35 U.S.C. 154(b) by 37 days.

(21) Appl. No.: 14/766,612

(22) PCT Filed: Feb. 7, 2014

(86) PCT No.: PCT/US2014/015357
§ 371 (c)(1),
(2) Date: Aug. 7, 2015

(87) PCT Pub. No.: WO2014/124293
PCT Pub. Date: Aug. 14, 2014

(65) Prior Publication Data
US 2015/0361241 A1  Dec. 17, 2015

Related U.S. Application Data

(60) Provisional application No. 61/762,658, filed on Feb. 8, 2013.

(51) Int. Cl.
*C08J 9/228*    (2006.01)
*H01C 7/00*    (2006.01)
(Continued)

(52) U.S. Cl.
CPC .............. *C08J 9/228* (2013.01); *C08K 3/01* (2018.01); *C08K 7/22* (2013.01); *C08K 7/24* (2013.01);
(Continued)

(58) Field of Classification Search
CPC . C08J 2003/22; C08J 9/228; C08K 2201/011; C08K 7/22; C08L 2207/04;
(Continued)

(56) References Cited

U.S. PATENT DOCUMENTS 3,779,951 A * 12/1973 Streu .................. B01J 13/203
                                                                521/145
5,706,175 A    1/1998 Takei
(Continued)

OTHER PUBLICATIONS

Tokai Carbon Co., Ltd., Physicochemical Properties Web page, http://www.tokaicarbon.co.jp/en/products/carbon_b/seast/, (retrieved Feb. 2, 2017).*
(Continued)

*Primary Examiner* — Kregg T Brooks
(74) *Attorney, Agent, or Firm* — Stites & Harbison, PLLC; Terry L. Wright

(57) ABSTRACT

A polymer composite is provided that includes a plurality of heat-absorbing nanomaterials, a plurality of thermally-expanding microspheres, and an elastomeric matrix. In the polymer composite, the heat-absorbing nanomaterials and the thermally-expanding microspheres are dispersed within the elastomeric matrix such that the thermally-expanding microspheres expand and stretch the matrix upon exposure to a thermal stimulus. Methods of forming a thermally-expanding polymer composite are also provided and include the steps of dispersing a plurality of heat-absorbing nanomaterials in an evaporative solvent; combining the dispersion with an amount of an elastomeric material to create a mixture; adding an amount of thermally-expanding micro-
(Continued)

Final circuit spheres to the mixture; and polymerizing the mixture. Circuits including resistors comprised of the polymer composites are further provided.

6 Claims, 24 Drawing Sheets

(51) Int. Cl.
      *H05K 1/02*         (2006.01)
      *H05K 1/16*         (2006.01)
      *H05K 1/03*         (2006.01)
      *C08K 3/00*         (2018.01)
      *C08K 3/04*         (2006.01)
      *C08K 7/22*         (2006.01)
      *C08L 101/12*       (2006.01)
      *C08L 83/04*        (2006.01)
      *C08K 7/24*         (2006.01)
      *C08K 9/10*         (2006.01)
      *C08K 3/01*         (2018.01)

(52) U.S. Cl.
    CPC ............... *C08K 9/10* (2013.01); *C08L 83/04* (2013.01); *H01C 7/008* (2013.01); *H05K 1/028* (2013.01); *H05K 1/0283* (2013.01); *H05K 1/167* (2013.01); *C08J 2203/22* (2013.01); *C08J 2333/20* (2013.01); *C08J 2383/04* (2013.01); *C08K 2201/011* (2013.01)

(58) Field of Classification Search
    CPC ...... C08L 83/04; H05K 1/028; H05K 1/0283; H05K 1/167; H01C 7/00–7/22
    See application file for complete search history.

(56) References Cited

U.S. PATENT DOCUMENTS

| | | | |
|---|---|---|---|
| 2006/0258793 A1* | 11/2006 | Nonaka | C08L 23/16 524/495 |
| 2007/0038807 A1 | 2/2007 | Kuczynski et al. | |
| 2009/0105394 A1* | 4/2009 | Kitamura | C08J 9/32 524/502 |
| 2012/0121907 A1* | 5/2012 | Masuda | B01J 13/20 428/402.21 |
| 2013/0261221 A1* | 10/2013 | Bosnyak | B60C 1/00 523/155 |

OTHER PUBLICATIONS

Shin-Etsu Silicone, Silicone Fluids Web Page, https://www.shinetsusilicone-global.com/products/type/oil/index.shtml (retrieved Feb. 2, 2017).*
Loomis et al., "Stimuli-responsive transformation in carbon nanotube/expanding microsphere-polymer composites," Nanotechnology 24(18), 185703 (Apr. 10, 2013).*
T. Hirai, H. Sadatoh, T. Ueda, T. Kasazaki, Y. Kurita, M. Hirai, S. Hayashi, Angew Makromol Chem 1996, 240, 221.
R. Pelrine, R. Kornbluh, Q. Pei, J. Joseph, Science 2000, 287, 836.
W. Lehmann, H. Skupin, C. Tolksdorf, E. Gebhard, R. Zentel, P. Kruger, M. Losche, F. Kremer, Nature 2001, 410, 447.
P. Ajayan, O. Stephan, C. Colliex, D. Trauth, Science 1994, 265, 1212.
H. Koerner, G. Price, N. Pearce, M. Alexander, R. Vaia, Nature Materials 2004, 3, 115.
P. Miaudet, A. Derre, M. Maugey, C. Zakri, P. Piccione, R. Inoubli, P. Poulin, Science 2007, 318, 1294.
L. Ci, J. Suhr, V. Pushparaj, X. Zhang, P. Ajayan, Nano Lett 2008, 8, 2762.
P. W. Barone, S. Baid, D.A. Heller, M.S. Strano, Near-infrared optical sensors based on single-walled carbon nanotubes. Nature Materials 2005, 4, 86-92.
Han, Ji-Eun, et al. "All polymer hair structure with embedded three-dimensional piezoresistive force sensors." Sensors and Actuators. Dec. 2012. vol. 188, pp. 89-94.
Ren, et al. "Thermo-adaptive functionality of graphene / PDMS nanocomposites." Smart Material and Structures, 2012. vol. 21, 105032.
Chemical resistance of Expancel Microspheres, Technical Information, Akzo Nobel NV, 2014.
Product Specification for Expancel Microspheres, Expancel DU, Akzo Nobel NV, Issue 2014.12.
Korean Intellectual Property Office, International Preliminary Report on Patentability issued in corresponding PCT Application No. PCT/US2014/015357, dated May 23, 2014.

* cited by examiner

STIMULI-RESPONSIVE POLYMER COMPOSITES

RELATED APPLICATIONS

This application claims priority from U.S. Provisional Application Ser. No. 61/762,658, filed Feb. 8, 2013, the entire disclosure of which is incorporated herein by this reference.

GOVERNMENT INTEREST

This invention was made with government support under grant number CMMI 1233996 awarded by the National Science Foundation. The government has certain rights in the invention.

TECHNICAL FIELD

The presently-disclosed subject matter relates to stimuli-responsive polymer composites. In particular, the presently-disclosed subject matter relates to stimuli-responsive polymer composites that include a plurality of thermally-expanding microspheres and heat-absorbing nanomaterials dispersed within an elastomeric matrix, such that the thermally-expanding microspheres expand and stretch the elastomeric matrix upon exposure to a stimulus.

BACKGROUND

Due to potential applications in smart systems, materials that sense external stimuli and execute responses that enhance overall system functionality are attractive areas for research. While some of these materials undergo reversible changes upon application of an external stimulus, others undergo irreversible changes. Examples of such stimuli-responsive materials include piezoelectrics, ferroelectrics, shape-memory alloys, electrostrictive materials, dielectric elastomers, liquid crystal elastomers, and conducting polymers. Despite, and in part because of, individual strengths and weaknesses, these materials have been implemented to fulfill various sensing and actuation roles in industrial smart systems.

In this regard, a decade of nanotube/polymer composite research has yielded a number of insights into the molecular design and mechanical properties of nanocomposites. Carbon nanotube fillers have been used to increase strength; as stress recovery agents in thermoplastic elastomers and IR actuators; to improve damping capability; as shape/temperature memory composites; as space durable films for electrostatic charge mitigation; to improve flammability resistance; as conductive scaffolds for printable composites and gels; as electro-responsive chromatic materials; and as skin-like pressure and strain sensors. The combination of high strength, light weight, and large elastic energies in these composites have been proposed for diverse applications ranging from high-end sports equipment to artificial muscles in humanoid robots. While important, many of these applications, however, merely incorporate nanotubes to accentuate already existing host matrix features (such as strength, toughness, conductivity), and there has been little success in the development of stimuli-responsive composites that exhibit dynamic changes in strength, conductivity, density, and volume (visible on macroscopic scales).

SUMMARY

The presently-disclosed subject matter meets some or all of the above-identified needs, as will become evident to those of ordinary skill in the art after a study of information provided in this document.

This Summary describes several embodiments of the presently-disclosed subject matter, and in many cases lists variations and permutations of these embodiments. This Summary is merely exemplary of the numerous and varied embodiments. Mention of one or more representative features of a given embodiment is likewise exemplary. Such an embodiment can typically exist with or without the feature(s) mentioned; likewise, those features can be applied to other embodiments of the presently-disclosed subject matter, whether listed in this Summary or not. To avoid excessive repetition, this Summary does not list or suggest all possible combinations of such features.

The presently-disclosed subject matter relates to stimuli-responsive polymer composites. In particular, the presently-disclosed subject matter relates to stimuli-responsive polymer composites where the physical dimensions, elastic modulus, density, and electrical resistance of the polymer composites can be transformed upon exposure to a stimulus. In some embodiments, a polymer composite is provided that comprises a plurality of heat-absorbing nanomaterials, a plurality of thermally-expanding microspheres, and an elastomeric matrix. In such a polymer composite, the heat-absorbing nanomaterials and the thermally-expanding microspheres are dispersed within the elastomeric matrix such that the thermally-expanding microspheres expand and stretch the matrix upon exposure to a thermal stimulus.

In some embodiments, the heat-absorbing nanomaterials are comprised of a material selected from the group consisting of carbon, molybdenum disulfide, tungsten disulfide, boron nitride, molybdenum diselenide, molybdenum ditelluride, tantalum diselenide, niobium diselenide, nickel ditelluride, bismuth telluride, and combinations thereof. In some embodiments, the heat-absorbing nanomaterials are carbon nanotubes, such as, in some embodiments, single-walled carbon nanotubes. In some embodiments, the heat-absorbing nanomaterials are dispersed within an elastomeric matrix comprised of a material selected from the group consisting of: polydimethylsiloxane, natural rubber, polyisoprene, butyl rubber, polybutadiene, styrene butadiene rubber, nitrile rubber, chloroprene rubber, polychloroprene, room temperature vulcanizing silicone, viton fluoroelastomers, copolymers of vinylidene fluoride and hexafluoropropylene, ethylene propylene rubber, ethylene propylene diene monomer rubber, copolymers of ethylene propylene diene monomer rubber and polypropylene, polyurethane rubber, resilin, polyacrylic rubber, epichlorohydrin rubber, polysulfide rubber, chlorosulfonated polyethylene, polyether block amide, and combinations thereof. In some embodiments, the elastomeric matrix is comprised of polydimethylsiloxane.

With respect to the thermally-expanding microspheres included in the polymer composites of the presently-disclosed subject matter, in some embodiments, the thermally-expanding microspheres comprise a copolymer shell encapsulating a liquid hydrocarbon core. For example, in some embodiments, the copolymer shell comprises an acrylic copolymer shell, such as an acrylic copolymer shell comprised of poly(vinylidene chloride-co-acrylonitrile-co-methyl methacrylate). In some embodiments, the liquid hydrocarbon core included in the thermally-expanding microspheres comprises isobutane, isooctane, methanol, propanol, ethanol, propanol, or butanol.

With further respect to the components of an exemplary polymer composite of the presently-disclosed subject matter, in some embodiments, the thermally-expanding microspheres have a diameter of about 5 µm to about 10 µm prior to exposure to the thermal stimulus and a diameter of about 10 µm to about 20 µm subsequent to exposure to the thermal stimulus. In some embodiments, the polymer composite comprises about 0.1 wt % to about 0.5 wt % of the heat-absorbing nanomaterials and about 5 wt % to about 50 wt % of the thermally-expanding microspheres. By incorporating such materials into an exemplary polymer composite, in some embodiments, the polymer composite is thereby configured to exhibit a volume expansion of greater than about 500%, a density reduction of greater than about 80%, an elastic modulus increase of greater than 675%, a change in resistance, or a combination of the foregoing upon exposure to a thermal stimulus.

Further provided, in some embodiments of the presently-disclosed subject matter, are methods for forming a polymer composite. In some embodiments, a method for forming a polymer composite is provided wherein a plurality of heat-absorbing nanomaterials are first dispersed in an evaporative solvent. The dispersion of heat-absorbing nanomaterials and evaporative solvent is then combined with a pre-heated amount of an elastomeric material that causes the evaporative solvent to evaporate and, consequently, creates a mixture of heat-absorbing nanomaterials and elastomeric material. Then, once the mixture of heat-absorbing nanomaterials and elastomeric material has sufficiently cooled, an amount of thermally-expanding microspheres is added to the mixture. The cross-linker is subsequently added to the mixture of heat-absorbing nanomaterials, elastomeric material, and thermally-expanding microspheres to polymerize the materials and to thereby create the polymer composite.

Still further provided, in some embodiments of the presently-disclosed subject matter are circuits that make use of the polymer composites of the presently-disclosed subject matter. For example, in some embodiments, a circuit is provided that includes a resistor comprised of a plurality of heat-absorbing nanomaterials, a plurality of thermally-expanding microspheres, and an elastomeric matrix. In some embodiments, the resistor can be comprised of a first resistor and a second resistor, where the first resistor includes a greater weight percentage of heat-absorbing nanomaterials than the second resistor to thereby impart different properties on the two resistors. Regardless of the particular amounts of materials included in the polymeric composites used in an exemplary circuit, however, by making use of the polymeric composites of the presently-disclosed subject matter, the circuit can be designed such that, upon exposure to a thermal stimulus, the circuit can become more conductive, less conductive, or maintain the same conductance.

Further features and advantages of the present invention will become evident to those of ordinary skill in the art after a study of the description, figures, and non-limiting examples in this document.

DESCRIPTION OF EXEMPLARY EMBODIMENTS

Figure 1A:
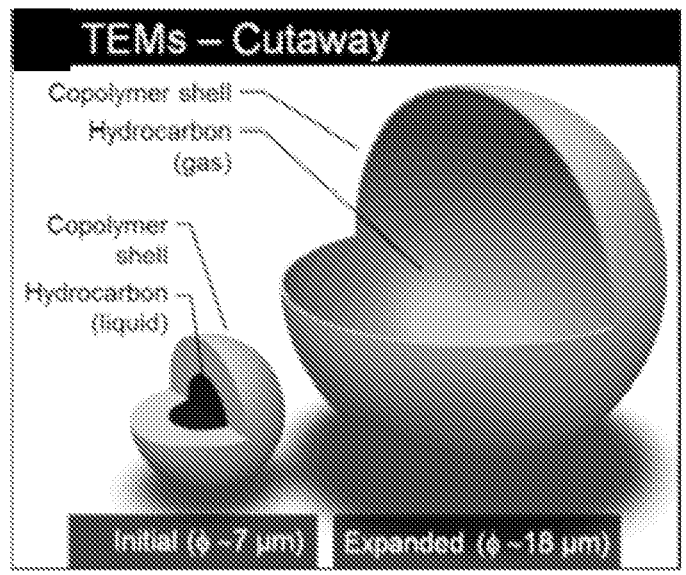
FIGS. 1A-1C include a schematic diagram and images showing examples of the thermally-expanding microspheres included in the polymer composites of the presently-disclosed subject matter, including: a schematic diagram showing the size relationship between initial and expanded microspheres (FIG. 1A); a scanning electron microscopy (SEM) image of loose unexpanded microspheres (average diameter of 7.1+1.9 µm) (FIG. 1B); and an SEM image of loose expanded microspheres (average diameter of 17.8+3.8 µm) (FIG. 1C)

The details of one or more embodiments of the presently-disclosed subject matter are set forth in this document. Modifications to embodiments described in this document, and other embodiments, will be evident to those of ordinary skill in the art after a study of the information provided in this document. The information provided in this document, and particularly the specific details of the described exemplary embodiments, is provided primarily for clearness of understanding and no unnecessary limitations are to be understood therefrom. In case of conflict, the specification of this document, including definitions, will control.

While the terms used herein are believed to be well understood by one of ordinary skill in the art, definitions are set forth herein to facilitate explanation of the presently-disclosed subject matter.

Unless defined otherwise, all technical and scientific terms used herein have the same meaning as commonly understood by one of ordinary skill in the art to which the presently-disclosed subject matter belongs. Although any methods, devices, and materials similar or equivalent to those described herein can be used in the practice or testing of the presently-disclosed subject matter, representative methods, devices, and materials are now described.

Following long-standing patent law convention, the terms "a", "an", and "the" refer to "one or more" when used in this application, including the claims. Thus, for example, reference to "a resistor" includes a plurality of such resistors, and so forth.

Unless otherwise indicated, all numbers expressing quantities of ingredients, properties such as reaction conditions, and so forth used in the specification and claims are to be understood as being modified in all instances by the term "about". Accordingly, unless indicated to the contrary, the numerical parameters set forth in this specification and claims are approximations that can vary depending upon the desired properties sought to be obtained by the presently-disclosed subject matter.

As used herein, the term "about," when referring to a value or to an amount of mass, weight, time, volume, concentration or percentage is meant to encompass variations of in some embodiments ±20%, in some embodiments ±10%, in some embodiments ±5%, in some embodiments ±1%, in some embodiments ±0.5%, and in some embodiments ±0.1% from the specified amount, as such variations are appropriate to perform the disclosed method.

As used herein, ranges can be expressed as from "about" one particular value, and/or to "about" another particular value. It is also understood that there are a number of values disclosed herein, and that each value is also herein disclosed as "about" that particular value in addition to the value itself. For example, if the value "10" is disclosed, then "about 10" is also disclosed. It is also understood that each unit between two particular units are also disclosed. For example, if 10 and 15 are disclosed, then 11, 12, 13, and 14 are also disclosed.

The presently-disclosed subject matter relates to stimuli-responsive polymer composites. In particular, it has been observed that a class of stimuli-responsive, expanding polymer composites can be produced where the physical dimensions, elastic modulus, density, and electrical resistance of the polymer composites can be transformed upon exposure to a stimulus, such that the polymer composites can then be used to pattern regions of tailorable expansion, strength, and electrical resistance into a single polymer skin. Moreover, the combination of filler materials and elastomeric matrix described herein, as well as the resulting binary set of material properties, allows for a number of research and industrial applications, including structural and electrical building blocks in smart systems, structural health monitoring of aircraft and ships, deformable elements for flight control surfaces, deformable mirror and antennae surfaces on spacecraft, strain sensing for roads and bridges, machinery vibration control systems, and biomedical applications, such as micropumps, stents, and targeted drug delivery.

In some embodiments of the presently-disclosed subject matter, a polymer composite is provided that comprises a plurality of heat-absorbing nanomaterials; a plurality of thermally-expanding microspheres; and an elastomeric matrix. In such a polymer composite, the heat-absorbing nanomaterials and the thermally-expanding microspheres are dispersed within the elastomeric matrix, such that the thermally-expanding polymers expand and stretch the matrix upon exposure to a thermal stimulus.

The term "heat-absorbing nanomaterials" is used herein to refer to nanoscale structures comprised of materials capable of absorbing heat and having various geometric configurations, but which typically have diameters of between 1 and 100 nm (e.g., nanowires, nanoparticles, or other nanostructures) and are typically 0-dimensional, 1-dimensional, or 2-dimensional. In some embodiments, the heat-absorbing nanomaterials are comprised of a material selected from the group consisting of carbon, molybdenum disulfide ($MoS_2$), tungsten disulfide ($WS_2$), boron nitride (BN), molybdenum diselenide ($MoSe_2$), molybdenum ditelluride ($MoTe_2$), tantalum diselenide ($TaSe_2$), niobium diselenide ($NbSe_2$), nickel ditelluride ($NiTe_2$), bismuth telluride ($Bi_2Te_3$), and combinations thereof. In some embodiments, the heat-absorbing nanomaterials can be characterized as carbon nanostructures, which include, but are not limited to, single-walled carbon nanotubes, multi-walled carbon nanotubes, graphene, graphene nanoplatelets, few layer graphene, single layer graphene, graphene oxide, reduced graphene oxide, carbon black, nanobuds, and graphenated carbon nanotubes. In some embodiments, the carbon nanostructures are carbon nanotubes or, in other words, an allotrope of carbon having a cylindrical nanostructure comprised of one or more walls formed by sheets of carbon. In some embodiments, the carbon nanotubes are single-walled carbon nanotubes.

Regardless of the particular heat-absorbing nanomaterial used in accordance with the presently-disclosed polymer composites, as described above, each polymer composite further includes a plurality of thermally-expanding microspheres. The thermally-expanding microspheres used in accordance with the presently-disclosed composites can be comprised of a variety of materials capable of expanding and increasing in volume upon exposure to a thermal stimulus. In some embodiments, the thermally-expanding microspheres comprise an outer shell that encapsulates a liquid hydrocarbon core. Such thermally-expanding microspheres include commercially-available thermally-expanding microspheres, such as EXPANCEL® microspheres (e.g., Expancel WU, Expancel WE, Expancel DU, Expancel Del., Expancel SL, and Expancel MB microspheres) manufactured by AkzoNobel (Pasadena, Calif.) and having expansion temperatures ranging from 100° C. to 200° C., initial (i.e., unexpanded) diameters as small as 6 μm, and final (i.e., expanded) diameters as large as 150 gm. In some embodiments, the thermally-expanding microspheres have a diameter of about 5 μm to about 10 μm prior to exposure to the thermal stimulus and a diameter of about 10 μm to about 20 μm subsequent to exposure to the thermal stimulus. Of course, as will be recognized by those skilled in the art, the selection of a particular thermally-expanding microsphere will vary depending on the particular properties that are desired for a particular application, but such microspheres can readily be selected for use in a particular application without departing from the spirit and scope of the subject matter described herein.

In some embodiments of the presently-disclosed subject matter, the thermally-expanding microspheres comprise a copolymer shell, such as an acrylic copolymer shell, that encapsulates a liquid hydrocarbon core. In some embodiments, the acrylic copolymer shell comprises poly(vinylidene chloride-co-acrylonitrile-co-methyl methacrylate) and, in some embodiments, the liquid hydrocarbon core comprises isobutane. In some embodiments, the liquid hydrocarbon core comprises isobutane, isooctane, methanol, ethanol, propanol, or butanol. In some embodiments, by making use of a such a combination of a copolymer shell and a liquid hydrocarbon core in connection with heat-absorbing nanomaterials and an elastomeric matrix, an exemplary polymer composite exhibits a volume expansion of greater than about 500%, a density reduction of greater than about 80%, an elastic modulus increase of greater than 675%, a change in resistance, or a combination thereof upon exposure to the thermal stimulus.

With further regard to the liquid hydrocarbon cores included in certain of the thermally-expanding microspheres, the liquid hydrocarbon cores are typically comprised of a hydrocarbon material that is liquid at lower temperatures, such as room temperature, but that is capable of vaporizing and expanding in volume upon exposure to a thermal stimulus, such as an infrared stimulus, optical stimulus, electrical stimulus, or other heat-generating stimulus. For example and as indicated above, in some embodiments, the liquid hydrocarbon comprises an isobutane liquid hydrocarbon as such a liquid hydrocarbon is capable of sufficiently vaporizing and expanding in volume at a temperature of about 125° C. As another example, in some embodiments, the liquid hydrocarbon core is comprised of liquid hydrocarbons that readily vaporize at temperatures of about 24° C. to about 30° C. or, in other words, at temperatures close to room temperature.

Turning now to the elastomeric matrices of the presently-disclosed polymer composites, each elastomeric matrix is typically comprised of a material in which the heat-absorbing nanomaterials and thermally-expanding polymers can be sufficiently dispersed, but that is also sufficiently viscoelastic to accommodate the expansion of the thermally-expanding polymers upon exposure of the polymer composites to a thermal stimulus, such as an infrared light source. Such materials include, but are not limited to, both synthetic and natural polymers. In some embodiments, the elastomeric matrix comprises polydimethylsiloxane (PDMS). Of course, the elastomeric matrices can also be comprised of numerous other elastomers including, but not limited to: natural rubber, polyisoprene, butyl rubber (copolymer of isobutylene and isoprene), polybutadiene, styrene butadiene rubber (SBR; copolymer of polystyrene and polybutadiene), nitrile rubber (copolymer of polybutadiene and acrylonitrile; a.k.a. buna N rubbers); chloroprene rubber, polychloroprene (e.g., neoprene), room temperature vulcanizing rubber (silicone RTV), viton fluoroelastomers (FKM Viton® (E.I. Du Pont De Nemours & Company, Wilmington, Del.), Tecnoflon® (copolymer of vinylidene fluoride and hexafluoropropylene, Solvay Solexis S.p.A., Bollate, Italy), copolymers of vinylidene fluoride and hexafluoropropylene, ethylene propylene rubber, ethylene propylene diene monomer rubber, copolymers of ethylene propylene diene monomer rubber and polypropylene (e.g., Santoprene®, Exxon Mobil Corporation, Irving Tex.); fluorosilicone rubber; polyurethane rubber, resilin, polyacrylic rubber (ABR), epichlorohydrin rubber (ECO); polysulfide rubber, chlorosulfonated Polyethylene (CSM, Hypalon®, DuPont Performance Fluoroelastomers LLC, Wilmington, Del.), polyether block amide (PEBA, Pebax®, Arkema Corporation, France), and combinations thereof.

Polymer composites made in accordance with the presently-disclosed subject matter can be fabricated using a variety of methods known to those of ordinary skill in the art, such as evaporative mixing, shear mixing, cross-linking, extrusion, stirring, sonicating, or other techniques capable of suitably creating mixture of heat-absorbing nanomaterials that can subsequently undergo polymerization. In some embodiments, a method for forming a polymer composite is provided wherein a plurality of heat-absorbing nanomaterials are first dispersed in an evaporative solvent. The dispersion of heat-absorbing nanomaterials and evaporative solvent is then combined with a pre-heated amount of an elastomeric material that causes the evaporative solvent to evaporate and, consequently, creates a mixture of heat-absorbing nanomaterials and elastomeric material. Then, once the mixture of heat-absorbing nanomaterials and elastomeric material has sufficiently cooled, an amount of thermally-expanding microspheres is added to the mixture. A cross-linker is subsequently added to the mixture of heat-absorbing nanomaterials, elastomeric material, and thermally-expanding polymer to polymerize the materials and to thereby create the polymer composite.

In one implantation of a method for fabricating a polymer composite in accordance with the presently-disclosed subject matter, a plurality of single-walled carbon nanotubes and thermally-expanding microspheres comprised of a poly (vinylidene chloride-co-acrylonitrile-co-methyl methacrylate) shell and liquid isobutane hydrocarbon core are first suitably dispersed in a PDMS matrix. Specifically, a desired amount of single-walled nanotubes are first dispersed in a suitable evaporative solvent and are then combined with a pre-heated PDMS base compound. As the solvent then evaporates as a result of the heat from the PDMS base compound, the single-walled nanotubes dispersed in the solvent are then effectively transferred to the PDMS base. That mixture of single-walled carbon nanotubes and PDMS can then be diluted with additional PDMS base, if desired, so as to obtain a desired wt % of single-walled nanotubes in the mixture. Then, once the single-walled carbon nanotubes and PDMS mixture has cooled to a temperature below which thermally-expanding microspheres would expand, a desired amount (e.g., wt %) of the thermally-expanding microspheres can be added to the mixture. Following the addition of the thermally-expanding microspheres, a cross-linker can then be added and mixed thoroughly with the materials to thereby produce a polymer composite of the presently-disclosed subject matter.

With respect to the amount of materials that may be included an exemplary polymer composite of the presently-disclosed subject matter, in some embodiments, an exemplary polymer composite comprises about 0.1 wt % to about 0.5 wt % of the carbon nanostructures and about 5 wt % to about 50 wt % of the thermally-expanding microspheres as such percentages have been found to allow for a sufficient volume expansion and density reduction of the composite upon exposure to a thermal stimulus, while still allowing for a desired increase in the elastic modulus and a change in the resistance of the polymer composite. In some embodiments, an exemplary polymer composite comprises about 0.1 wt %, about 0.2 wt %, about 0.3 wt %, about 0.4% wt %, or about 0.5 wt % of the carbon nanostructures. In some embodiments, an exemplary polymer composite comprises about 5 wt %, about 10 wt %, about 15 wt %, about 20 wt %, about 25 wt %, about 30 wt %, about 35 wt %, about 40 wt %, about 45 wt %, or about 50% of the thermally-expanding microspheres.

The above-described polymer composites, which allow for an elastic to plastic-like transformation upon exposure to a thermal stimulus, are important both for incorporating sensing and actuation into a single coherent functional material and for minimizing the complexity and maximizing the reliability of such materials. Furthermore, the benefits of thermal- (e.g., infrared, optical, or electrical) induced microsphere expansion include wireless actuation, electromechanical decoupling (and therefore low noise), and massive parallel actuation of device arrays from a single light source. Moreover, the presently-disclosed polymer composites provide the ability to use focused infrared illumination to expand a specific area or the entire composite, as well as the ability to pattern various filler compositions into a single polymer skin and thereby provide a diverse set of properties (such as regions of variable expansion, conductivity, and strength) in one continuous composite, which can then be changed on-demand for structural and/or electrical components. For example, thin unexpanded flexible polymer composite films can be incorporated into vehicle and/or equipment skins, and later expanded to provide on-demand structural elements preventing system failure. As another example, in applications where volume is critical, such as aerospace and space travel, thin elastic polymer films can be fabricated and subsequently rolled-up for shipping or launch only to be later expanded to function as electrical, mechanical, and structural components. As other examples of the application of the polymer composites of the presently-disclosed subject matter, the polymer composites can additionally be used as carpet underlays to increase friction, as waterborne printing inks for 3-dimensional applications and to provide a velvet look or other surface effects, as technical textiles and paint and crack fillers to reduce weight and improve applicability, as reflective coatings to increase solar reflection and thermal insulation, as leather finishing materials to increase filling capacity and provide leather that is soft to the touch, as concrete that allows for reliable frost resistance and reduced shrinkage, in woven materials to reduce weight and save costs, in industrial nonwoven textiles to improve bulk and thickness as well as cost savings, as UBC and sealants for a controlled and uniform cell structure, as an alternative silicone rubber having low weight and shape recovery characteristics, as shoe soles having a low weight and matt surface, as artificial leather to provide the look of suede or nubuck, as underbody coatings to reduce weight while maintaining other properties, as polyester putties that allow for improved sandability, as cultured marble to reduce density and improve thermo shock resistance, as a model making board to improve workability and sandability, as caulks and sealants to reduce costs while maintaining caulk- and sealant-associated properties, as printing blankets to improve compressibility, and in boxboard and fine paper to improve the bulk and stiffness of such materials.

As an even further example of the use of the polymer composites of the presently-disclosed subject matter, in some embodiments, the polymer composites can be incorporated into circuits that are capable of changing conductance. For example, in some embodiments, a circuit is provided that includes a resistor comprised of a plurality of carbon nanostructures, a plurality of thermally-expanding microspheres, and an elastomeric matrix. In some embodiments, the resistor can be placed on a suitable substrate and used to connect two electrically-conductive materials (see, e.g., FIG. 13). In some embodiments, the resistor included in an exemplary circuit is comprised of a first resistor and a second resistor, where the first resistor includes a greater weight percentage of carbon nanostructures than the second resistor as it has been determined that the inclusion of a higher weight percentage of carbon nanostructures in a polymer composite is capable of increasing the conductance of a polymer composite of the presently-disclosed subject matter. In this regard, and regardless of the a particular amounts of materials included in the polymeric composites used in an exemplary circuit, by making use of the polymeric composites of the presently-disclosed subject matter, a circuit can be designed such that, upon exposure to a thermal stimulus (e.g., exposure to an infrared light source or via the application of electrical current to the circuit), the circuit can become more conductive, less conductive, or maintain the same conductance.

The presently-disclosed subject matter is further illustrated by the following specific but non-limiting examples.

EXAMPLES

Materials and Methods for Examples 1-3

Figure 1B:
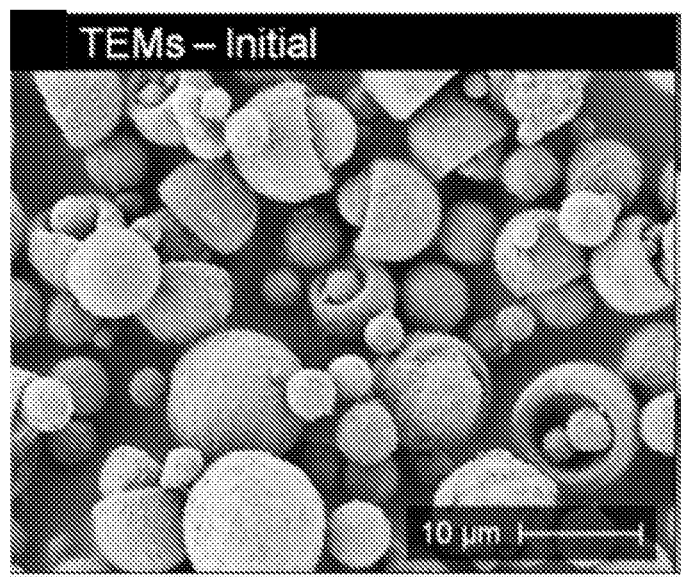
Figure 1C:
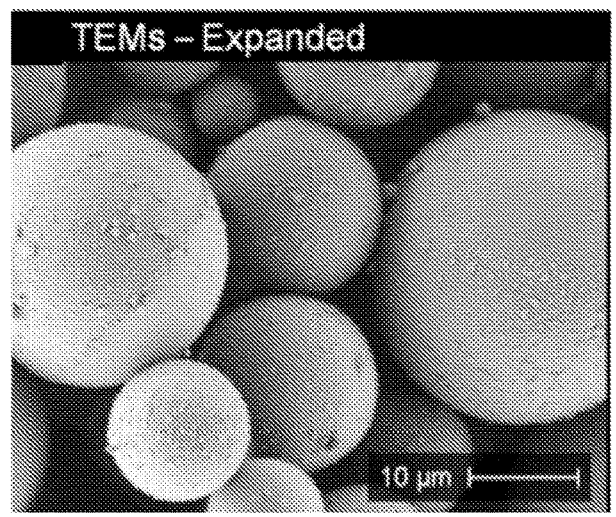
Figure 2A:
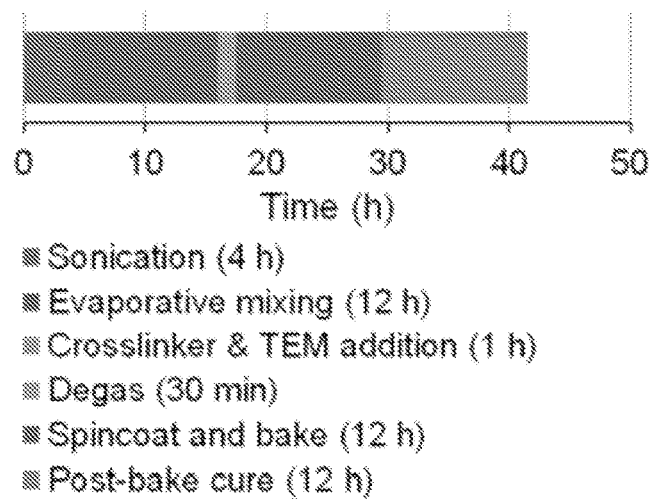
FIGS. 2A-2B include a schematic diagram and a graph showing fabrication steps and relationships for the polymer composites of the presently-disclosed subject matter, including: a schematic diagram showing an average evaporative mixing timeline for the polymer composites (FIG. 2A); and a graph of the resistivity (ρ) versus SWNT wt % loading (data fit to a NIST MGH10 nonlinear regression equation) (FIG. 2B)
Figure 2B:
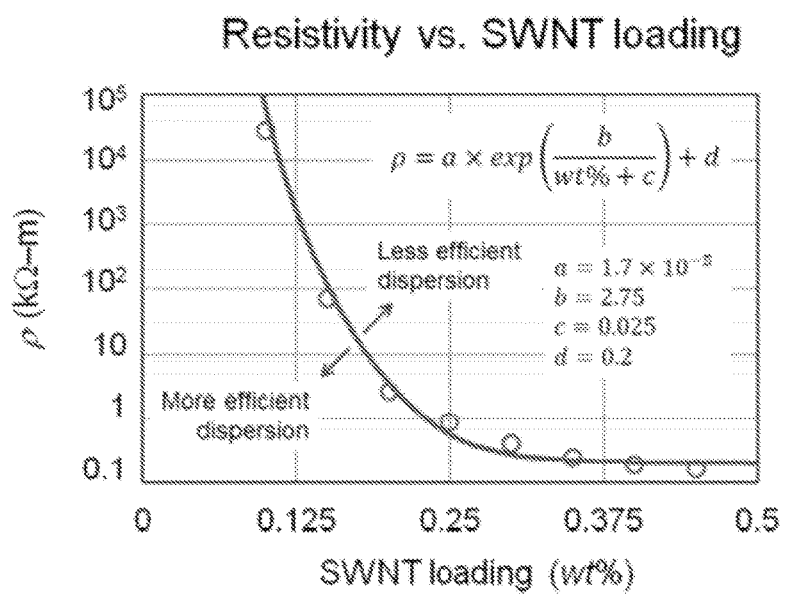

Raw materials: Thermally expanding microspheres (TEMs; Expancel 461 DU 20) were obtained from AkzoNobel. Depending on hydrocarbon and outer shell material selection, the TEMs had expansion temperatures ranging from 100 to 200° C., initial (unexpanded) diameters as small as 6 µm, and final (expanded) diameters as large as 150 µm. The TEMs chosen for the following studies included a poly(vinylidene chloride-co-acrylonitrile-co-methyl methacrylate) acrylic copolymer shell encapsulating an isobutane liquid hydrocarbon (see, e.g., FIG. 1A). Unexpanded scanning electron microscopy (SEM) images (FIG. 1B) and diameter measurements were taken on loose TEMs deposited on a silicon wafer. TEMs were then thermally expanded at 125° C. for 10 min, and SEM images (FIG. 1C) and diameter measurements taken again. In each case, a sample size of 500 microspheres was used to determine average diameter and standard deviation. Sylgard 184 silicone elastomer (Fisher Scientific, Waltham, MA) was chosen as the matrix because that polymer was commonly used in industrial/scientific research and was biocompatible. SWNTs (>99% purity) were obtained from Cheap Tubes, Inc. (Brattleboro, Vt.), and were primarily selected because their small diameters (1-2 nm) and long lengths (3-30 µm) were found to have several beneficial properties over other graphitic carbon forms initially tested, including high aspect ratios and the ability to achieve conductivity in resulting composites at a relatively low wt % loading.

Evaporative mixing fabrication: A 1 mg/mL concentration SWNT/ isopropanol (IPA) solution was sonicated for approximately 4 h. Separately, PDMS base compound was heated to 160° C., while a magnetic stir bar (60 rpm) provided agitation. Approximately 1 mL min$^{-1}$ of SWNT/IPA solution was added to the PDMS mixture. As the IPA boiled/evaporated off, dispersed SWNTs were transferred to the PDMS base compound. After securing SWNT/IPA addition, the mixture was heated for additional 2 h (approximately 12 h total heating time). The PDMS base compound/SWNT mixture was then removed from heat and allowed to cool. The mixture was divided and diluted with pristine PDMS base compound (which also went through the evaporative mixing process, but with plain IPA—no SWNTs) as necessary in order to obtain desired lower wt % concentrations. As opposed to the SWNTs that were difficult to disperse, TEMs are well suited for shear mixing. Additionally, as evaporative mixing would have resulted in microsphere expansion, TEMs were added to the mixture following dilution. Equations (1) and (2) were used to determine grams of SWNTs and TEMs needed, respectively ( $m_{SWNT}$ and $m_{TEM}$), depending on wt % desired ($m_{base}$ and $m_{cross}$ are amount of PDMS base and crosslinker).

$$m_{SWNT} = \frac{SWNT_{wt\%}(m_{base} + m_{cross})}{(100\% - SWNT_{wt\%} - TEM_{wt\%})} \quad (1)$$

$$m_{TEM} = \frac{TEM_{wt\%}(m_{base} + m_{cross} + m_{SWNT})}{(100\% - TEM_{wt\%})} \quad (2)$$

Crosslinker was added to the mixture at a ratio of 10:1 (PDMS base compound/crosslinker) and shear mixed for approximately 5 min. Finally, mixtures were placed in a vacuum chamber and degassed for approximately 30 min to removed trapped air bubbles.

Spin coating: Standard 50 mm×75 mm microscope slides were cleaned and dried. SWNT/TEM/PDMS was then deposited onto the slides, and spun to achieve nominal 300 µm thick films (various spin speeds were used due to different mixture viscosities). In order to not expand the microspheres, spin-coated sliders were polymerized at 65° C. for 12 h. As SWNT wt % increased, reliability of spin casting to produce consistent film thickness diminished. Therefore, SWNT composites were limited to less than 0.45 wt % (this issue was not noticed with TEMs). Following polymerization, composites were allowed to cure for an additional 12 h at room temperature prior to testing.

Expansion testing: For expansion testing, in order to minimize measurement errors, relatively large samples (50 mm diameter×5 mm height) were fabricated. After polymerization and removal from molds, mass and initial dimension measurements were taken. Next, samples were thermally expanded in an oven at 125° C. for 10 min and post expansion measurements made. Percent volume ($V_{\%}$) change was calculated according to equation (3).

$$V_{\%} = 100\% \times \left( \frac{V_{expanded} - V_{initial}}{V_{initial}} \right) \quad (3)$$

Similarly, percent change in diameter ($d_{\%}$), and density ($\Sigma_{\%}$) were calculated. Theoretical volume and density curves (FIGS. 4A-4B) were calculated according to simplified equations (4) through (6), where $V_{\% \, theory}$ is theoretical percent change in volume, $m_{PDMS}$ is mass of the PDMS component (including crosslinker), $m_{total}$ is total composite mass, $\rho_{PDMS}$ and $\rho_{TEM}$ are PDMS and unexpanded TEM densities, $r_i$ and $r_f$ are initial and expanded TEM diameters, and $\rho_{i \, theory}$ and $\rho_{f \, theory}$ are initial and expanded composite densities, respectively.

$$V_{\% \, theory} = 100\% \times \frac{\left(\frac{r_f}{r_i}\right)^3 - 1}{\left(\frac{m_{PDMS} \, \rho_{TEM}}{m_{TEM} \, \rho_{PDMS}}\right) + 1} \quad (4)$$

$$\rho_{i \, theory} = \frac{m_{total}}{\frac{m_{TEM}}{\rho_{TEM}} + \frac{m_{PDMS}}{\rho_{PDMS}}} \quad (5)$$

$$\rho_{f \, theory} = \frac{m_{total}}{\frac{m_{TEM}}{\rho_{TEM}}\left(\frac{r_f}{r_i}\right)^3 + \frac{m_{PDMS}}{\rho_{PDMS}}} \quad (6)$$

Mechanical testing: Stress-strain data was taken on a Rheometric Mechanical Analyzer (RMA, TA instruments-Waters LLC). Composites were strained to 25% over 200 s. Initial (unexpanded) composite sample dimensions were 40 mm×6 mm. Similarly, expanded composites were cut with the identical dimensions and thermally expanded at 125° C. for 10 min. In all calculations, initial (unexpanded) cross-sectional area was used, while test length was kept at 40 mm.

Electrical testing: A custom infrared light-emitting diode (IR LED) expansion test station was built that simultaneously illuminated both front and back of a 50 mm×4 mm composite sample test sample. Total LED radiant flux was 1.8 W, and distance between sample surface and each LED was 10 mm. The entire test station was enclosed within a light isolated "black box." Electrodes were connected to the top and bottom of each sample and supplied with 1 µA source current for resistance measurements. A machine vision system monitored composite expansion in real time. Testing sequence for each sample consisted of 5 min stabilization time (which was averaged for $R_0$), followed by 45 s of IR illumination, and concluded with 5 min post illumination wait (averaged for $R_f$). Sequencing and data recording was controlled remotely with LabVIEW software, which logged resistance and expansion position measurements every 100 ms and 200 ms, respectively.

SEM and Raman spectroscopy: SEM imaging was conducted on a Zeiss SUPRA 35VP field emission scanning electron microscope. Composite and loose TEM samples were mounted/placed on silicon substrates unless otherwise noted. Raman spectroscopy was conducted on an inVia RENISHAW micro-Raman spectrometer. The 632.8 nm line beam of a helium-neon laser was focused onto the sample surface through a ×100 objective lens, forming a laser spot approximately 1 µm in diameter.

Example 1

Stimuli-responsive Transformation

Figure 3A:
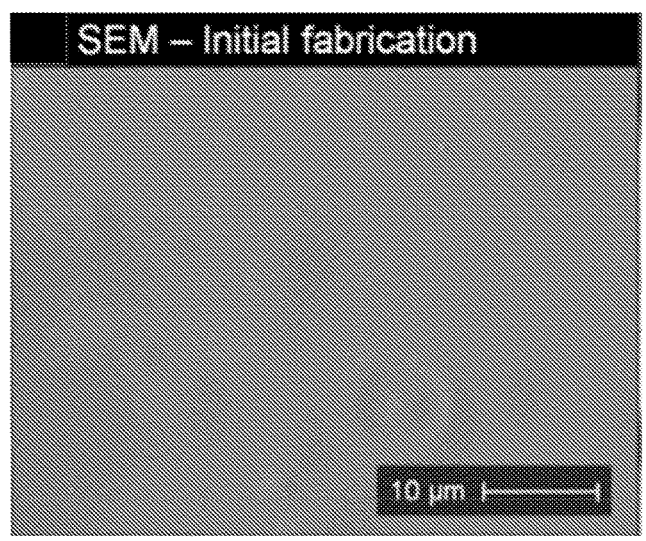
FIGS. 3A-3D include SEM images and schematic diagrams showing the effects of microsphere expansion, including: an SEM image showing the smooth surface of the initial fabricated composites (0.3 wt % SWNT, 31.2 wt % TEM) (FIG. 3A); an SEM image of the same composite sample after expansion and with microspheres clearly visible (FIG. 3B); a schematic diagram showing that unexpanded TEMs exhibit little influence over bulk composite properties (FIG. 3C); and a schematic diagram showing that the larger surface area associated with expanded TEMs greatly inhibits polymer chain movement and results in macroscopic material property changes (FIG. 3D)
Figure 3B:
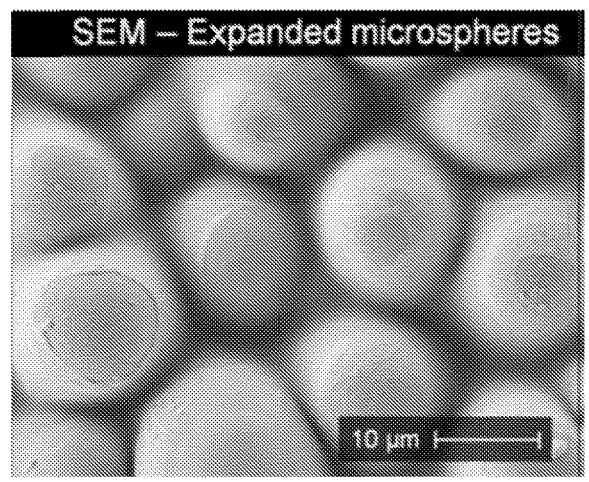

Incorporation and subsequent thermal expansion of TEMs in SWNT/polymer composites resulted in changes to the polymer matrix. Upon application of thermal or IR stimuli, microsphere expansion resulted in an eye-observable transformation of the initial (as-fabricated) elastic polymer composite into a plastic-like state. FIG. 3A shows the smooth surface of an initial fabricated (0.3 wt % SWNT, 31.2 wt % TEM) unexpanded composite. In that image, neither SWNTs nor TEMs were discernible from the bulk polymer matrix; however, post expansion (FIG. 3B) individual microspheres were clearly seen bulging out of the bulk polymer. Examination of the area between adjacent microspheres showed the matrix had been stretched into local thin (greater than 1 µm) polymer films, the thickness of which was observed to be inversely proportional to microsphere loading.

Figures 3C, 3D:
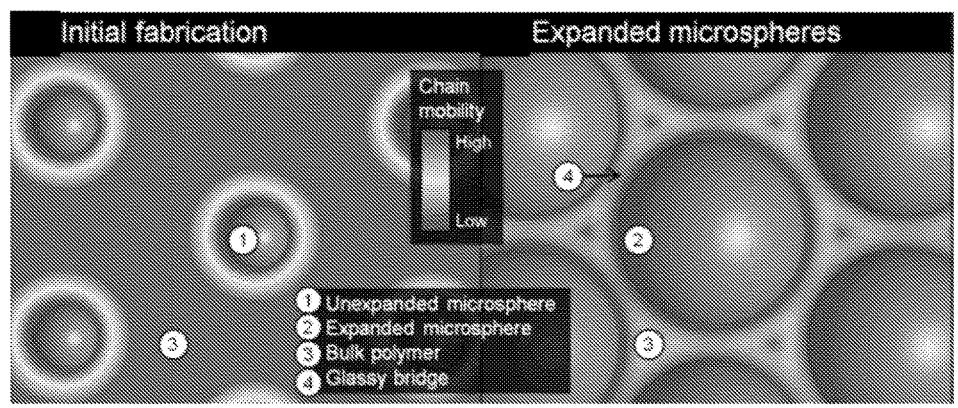

In composite materials, observations have demonstrated that at the filler-polymer interface—chain mobility is restricted (confirmed via nuclear magnetic resonance measurements) resulting in a thin region of glassy-like behavior. Chain mobility restriction decreases as distance from the filler increases, following a gradient back to the bulk matrix. In initial composites, glassy regions surrounding unexpanded microspheres were relatively small compared to the bulk polymer (as FIG. 3C shows). Since the majority of bulk polymeric chain mobility remains unaffected, macroscopic composites retain elastic properties. As TEMs expand, however, the matrix between adjacent microspheres stretches into local submicron polymer films, emulating substantially greater filler loading. Due to TEM surface area increasing on expansion, corresponding polymer chain restrictions also increase (FIG. 3D), resulting in macroscopic transformation of the entire system from an elastic to plastic-like state. Resulting polymer mobility between adjacent filler particles is hindered, possibly forming glassy-like flexible bridges. Such expansion-induced alteration of the polymeric chain conformations observed are thought to be useful in adaptive and responsive interface development.

Example 2

Binary Mechanical Properties

Figure 4A:
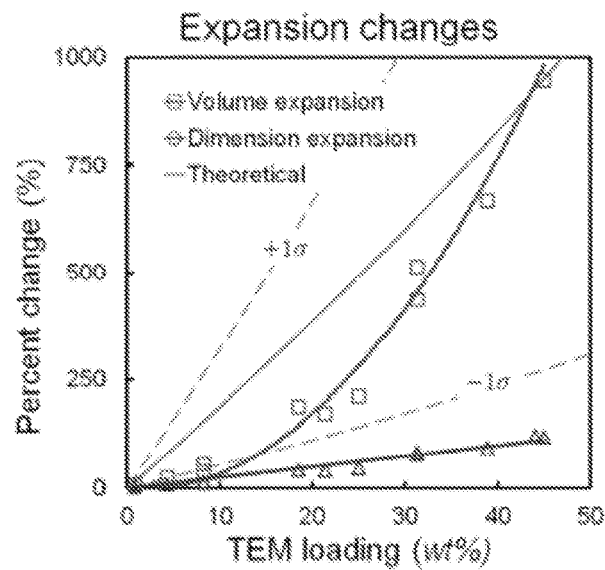
FIGS. 4A-4C include graphs and an image showing the expansion and density of polymer composites of the presently-disclosed subject matter, including: a graph showing expansion versus TEM wt % and including dimensional and volumetric curves (FIG. 4A); a graph showing density versus TEM wt % and showing reduction between the initial and expanded composites (FIG. 4B); and a SEM cross-sectional image of the expanded composite, showing large cavities inside the microspheres as well as several polymer-coated SWNTs (FIG. 4C)
Figure 4B:
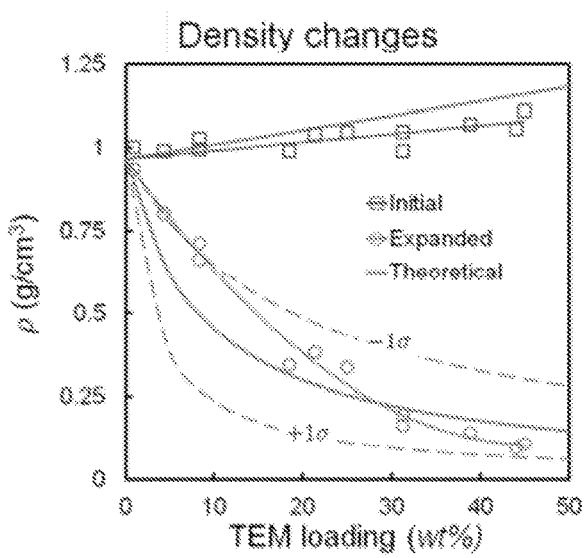
Figure 4C:
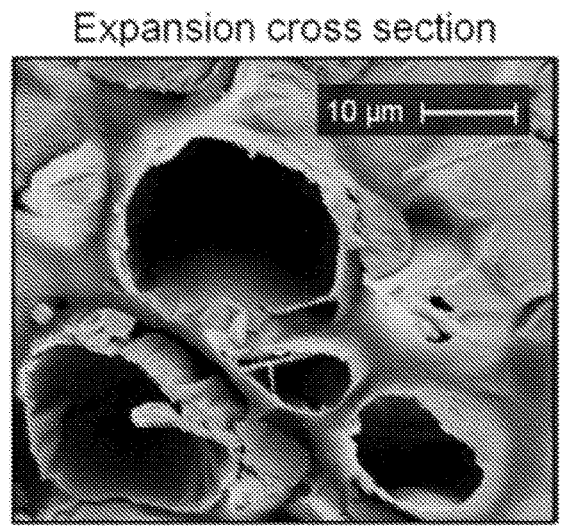
Figure 5A:
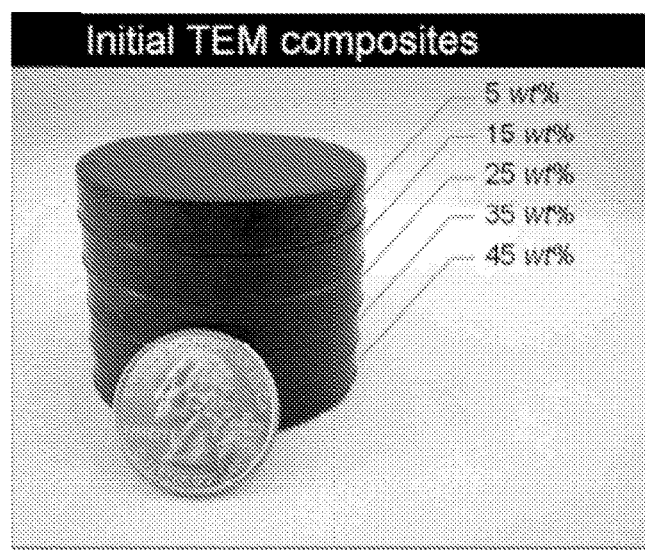
FIGS. 5A-5B are images showing volume and dimensional expansion plugs (45 mm diameter, 8 mm height) that were used to determine expansion changes as a function of increasing TEM wt %, including: an image showing initial (as-fabricated) expansion plugs, in the initial or elastic state where TEM loading levels from 5 wt % (top plug) to 45 wt % (bottom plug) were evaluated (FIG. 5A); and an image showing expanded, or plastic-like, plugs, where the relationship between increased TEM loading and the resulting volumetric increase was clearly visible and where, as the TEM wt % increases, the color change in the expanded composites was more noticeable compared to the initial plug (FIG. 5B)
Figure 5B:
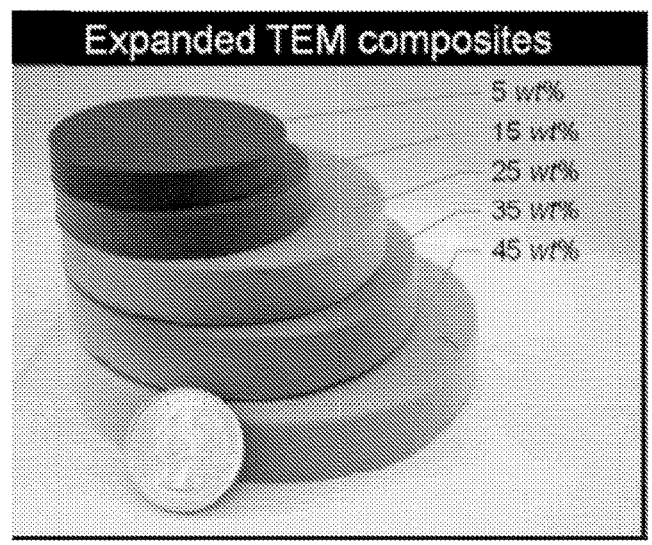

Because reinforcing materials were uniformly distributed and randomly oriented in the PDMS matrix, fabricated composites exhibited isometric dimensional and volumetric expansion. FIG. 4A shows the percent change of these quantities as a function of increasing TEM wt %. Theoretical as well as ±1σ volume expansion curves (based on average TEM unexpanded/expanded size analysis) are also included. For a side-by-side comparison of initial and expanded composites, see FIGS. 5A-5B. Since composite mass is constant but volume increases upon TEM expansion, there was a corresponding decrease in density. FIG. 4B compares initial and expanded density as a function of TEM loading, with theoretical curves included as well. Because theoretical and ±1σ curves were determined based on measurements of loose TEMs not in a matrix, slight underperformance of experimental results compared to theoretical values was expected. While volumetric expansions up to greater than 900% were witnessed (45 wt % TEM), subsequent experimental work was done with 31.2 wt % samples. This loading still yielded an impressive volume increase of greater than 500% and density reduction of greater than 80% while maintaining composite integrity. This level yielded an impressive volume increase of greater than 500% and density reduction of greater than 80% while maintaining composite integrity. FIG. 4C is an expanded composite cross-section showing morphology detail of several hollow microspheres and polymer-coated SWNTs.

With further regard to the TEM loading choice for mechanical and electrical test composites, while high TEM wt % was desirable from an expansion perspective, there were associated drawbacks. Increased microsphere loading lowered the PDMS matrix to reinforcing material ratio. Since the PDMS matrix provided polymeric chains responsible for binding the composite, filler loading could be large enough such that resulting structures were not stable and tend to break apart or crack upon expansion. This response was observed to occur above greater than 50 wt % TEM loading. While volumetric expansions up to greater than 900% were witnessed (45 wt % TEM), subsequent experimental work was done with 31.2 wt % samples.

Figure 6A:
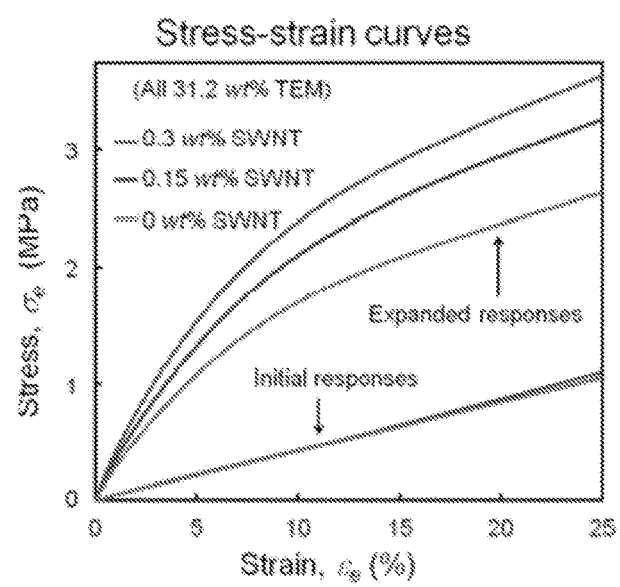
FIGS. 6A-6D include graphs and images showing stress-strain relationships in the polymer composites of the presently-disclosed subject matter, including: composite stress-strain curves (all 31.2 wt % TEM) with 0, 0.15, and 0.3 wt % SWNT loading, where the lower set of curves are initial (elastic) responses and the upper set of curves are expanded (plastic-like) responses (FIG. 6A); comparison curves showing percent increase in Young's modulus as a function of SWNT loading (FIG. 6B); an SEM image of expanded composite (0.3 wt % SWNT, 31.2 wt % TEM) at 40% strain, where the circled areas highlight several polymer-induced creases on the microspheres (FIG. 6C); and an SEM image of expanded composite (0.3 wt % SWNT, 31.2 wt % TEM) showing polymer-covered SWNT stretched across expanded TEM at strain of 40%, where a nanotube is bridging bulk polymer on either side of the microsphere (FIG. 6D)

While volumetric and density changes were the most visual effects, they were in addition to the interesting synergistic effects observed between the SWNTs, TEMs, and the polymer matrix. Just as microsphere expansion caused macroscopic dimensional changes, expansion also altered loading distribution within the composites. To examine these effects, engineering stress ($\sigma_e$) versus engineering strain ($\varepsilon_e$) was examined for initial and expanded samples (FIG. 6A). For all samples, $\sigma_e$ was calculated using initial (unexpanded) cross-sectional area. Three composite recipes were tested, (all 31.2 wt % TEMs) including 0, 0.15, and 0.3 wt % SWNTs. Interestingly, not only did all three exhibit similar elastic stress responses in the initial (unexpanded) state, but they also followed Hooke's law ($\sigma_e \approx E\varepsilon_e$) up to approximately 25% strain. After microsphere expansion however (upper set of curves), significant variations in composite strength existed and Hooke's law applied in a much smaller region, reaching the proportional limit at approximately 1% strain. A direct correlation was found to exist between increasing SWNT wt % and increasing strength. Expansion of a 0.3 wt % SWNT, 31.2 wt % TEM composite resulted in a remarkable 675% increase in Young's modulus (E) as compared to the same wt % unexpanded sample, greater than most nanotube/polymer composites to date. Furthermore, microsphere expansion also transformed the classic elastic stress-strain responses seen in the unexpanded composites into something more indicative of a plastic material. Hence, the expanded composites were referred to as "plastic-like."

Figure 6B:
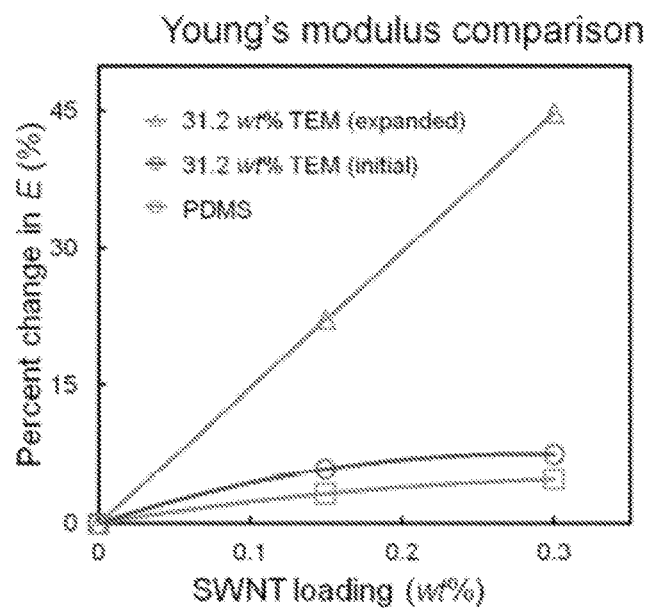
Figure 6C:
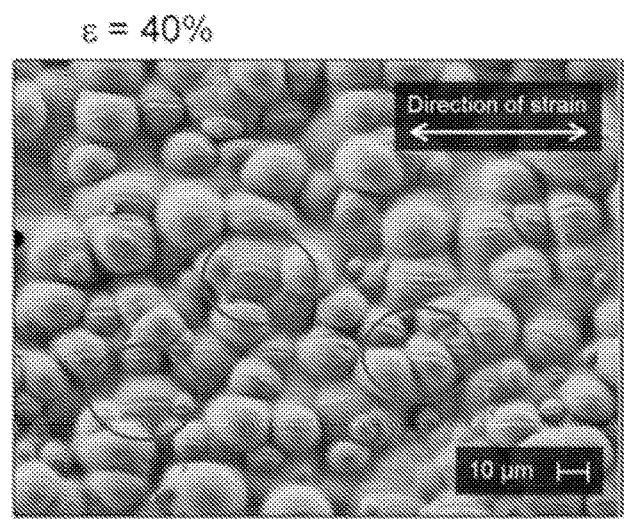
Figure 6D:
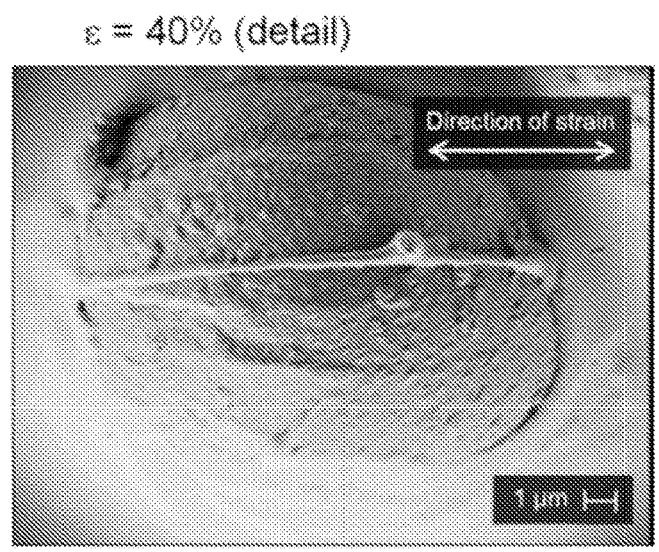

Since the success of SWNTs as structural reinforcements in composites hinges, in part, on effective load transfer from the matrix to nanotubes, increases in Young's modulus were evaluated as a function of nanotube wt % in initial and expanded composites (FIG. 6B, plain PDMS is included for reference). In the initial (unexpanded) composite samples, addition of randomly oriented, untensioned SWNTs does not significantly alter Young's modulus. For example, in an unexpanded microsphere (31.2 wt %) composite, inclusion of 0.3 wt % SWNTs resulted in only an approximately 7.5% increase in E compared to 0 wt % SWNT unexpanded sample. Post-expansion, however, inclusion of the same amount of nanotubes (0.3 wt %), resulted in E increase of approximately 45% compared to 0 wt % SWNT expanded composite. After initial fabrication, carbon nanotubes were randomly oriented and untensioned, resulting in minimal effect on elastic properties. However, microsphere-induced expansion and subsequent thin film formation in composites resulted in nanotube tensioning. While still randomly oriented, nanotube tensioning resulted in enhanced load transfer. Furthermore, due to random orientation, the strengthened bulk composite retained beneficial isotropic properties, vice anisotropic properties typically associated with aligned carbon nanotube composites. These results are supported by past reports that show composites with aligned as opposed to random nanotube distributions are three times more effective as reinforcement materials. Expansion-induced tensioning of carbon nanotubes has not been reported in previous studies and could represent a paradigm in stimuli-responsive composites. Furthermore, strength increases in the present composites were found to be on par with those predicted by theoretical models such as rule of mixtures and Halpin-Tsai equations (see FIGS. 7A-7C). FIGS. 6C-6D are SEM images of 0.3 wt % SWNT, 31.2 wt % TEM samples at 40% strains. Crease lines imparted from the polymer onto the TEMs are clearly visible in FIG. 6C, with several circled for clarity. FIG. 6D shows a polymer-covered SWNT stretched across an expanded microsphere acting as a nano-tether and providing strength to the expanded composite.

With regard to the derivation of the experimental data and theoretical model comparison, past work by Coleman et al. presented a concise, well-written summary of the theory of fiber-reinforced materials. Specifically, that work showed how the rule of mixtures and Halpin-Tsai equations can be applied to predict Young's moduli for both aligned and randomly oriented fiber-reinforced composites. In the present ternary composite systems, microsphere expansion and subsequent matrix stretching results in SWNT tensioning. As such, tensioning-induced elastic moduli increase (from experimental data) to alignment-induced elastic moduli increase (from theoretical models) was quantitatively compared. In this regard, the predicted alignment-induced increase in Young's modulus (as a function of SWNT wt %) was calculated using both Halpin-Tsai and rule of mixtures theoretical models. Next, equations were derived to relate the increase in modulus as a result of TEM expansion-induced tensioning, and those results were compared to the results predicted by existing theoretical models.

The rule of mixtures and Halpin-Tsai equations [equations (S3)-(S8), and (S11)] were taken from J. Coleman, et al. (*Carbon* 2006, 44, 1624). While SWNT wt % was used as the standard throughout the present work, Halpin-Tsai and rule of mixtures equations are based on volume fraction ($V_f$). Therefore, equations (S1) and (S2) below were used to transform wt % to $V_f$ (to maintain consistency with other figures, $V_f$ was converted to Vol % for plotting purposes).

$$V_f = \frac{\frac{\text{wt \%}_{SWNT}}{\rho_{SWNT}}}{\frac{\text{wt \%}_{SWNT}}{\rho_{SWNT}} + \frac{100 - \text{wt \%}_{SWNT}}{\rho_{TEM/PDMS}}} \quad (S1)$$

$$\text{Vol \%} = 100 V_f \quad (S2)$$

Figure 7A:
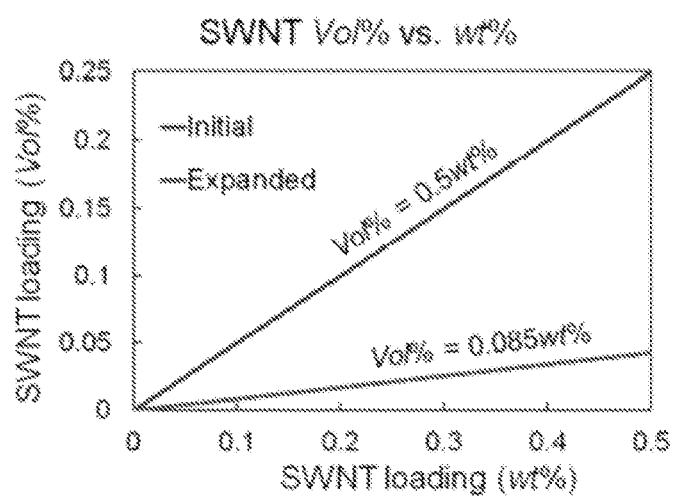
FIGS. 7A-7C include graphs showing a comparison of experimental data obtained with the polymer composites of the presently-disclosed subject matter to theoretical models, including: a graph showing the relationship between volume percent and wt %, where the expanded (upper) curve illustrates volumetric increase (and thus density reduction) resulting from microsphere expansion (FIG. 7A); a graph, using experimental data and theoretical models, and showing the ratio of increase in Young's modulus between aligned and randomly oriented SWNT composites (FIG. 7B); and a graph comparing the increase in Young's modulus as a result of expansion-induced SWNT tensioning (FIG. 7C)
Figure 7B:
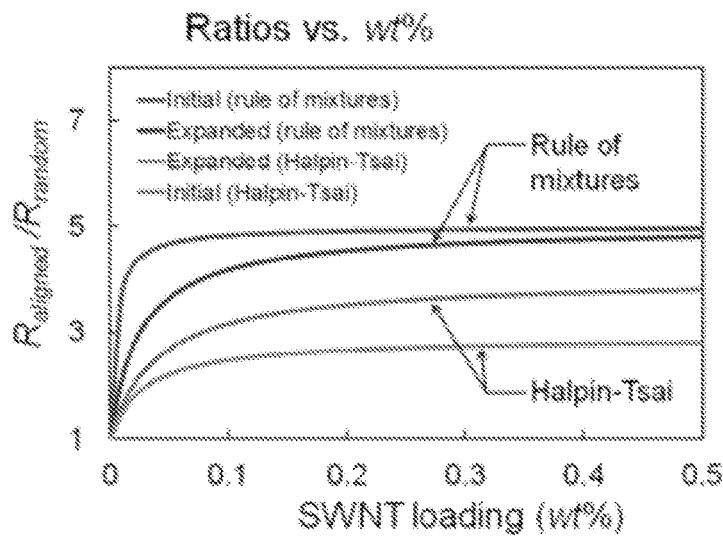
Figure 7C:
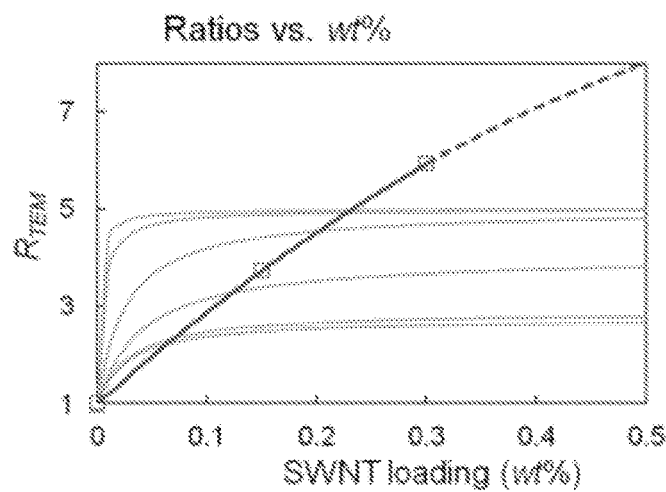

Variables $\rho_{SWNT}$ and $\rho_{TEM/PDMS}$ are the densities of the SWNTs and TEM/PDMS matrix, respectively. A SWNT density of 2.1 g/cm³ was used per the manufacturer's documentation, and TEM/PDMS densities of 1.045 g/cm³ and 0.178 g/cm³ were used for initial and expanded samples, respectively (based on experimental data). FIG. 7A shows the relationship between wt % and Vol %. For a given SWNT loading, microsphere expansion results in no change in wt %, but an approximately 80% reduction in Vol %.

Halpin-Tsai equations for aligned fiber reinforced composites are presented in equations (S3)-(S5) below, where $Y_c$ and $Y_m$ are Young's moduli of the composite and matrix, respectively; l and d are fiber length and diameter, respectively; and $V_f$ is the filler volume fraction.

$$Y_{c\_aligned} = Y_m \frac{1 + \xi \eta V_f}{1 - \eta V_f} \quad (S3)$$

$$\xi = \frac{2l}{d} \quad (S4)$$

$$\eta = \frac{Y_f/Y_m - 1}{Y_f/Y_m + 1} \quad (S5)$$

Slightly more complicated than the equations for aligned composites, the Halpin-Tsai equations (S6)-(S8) for randomly oriented fiber-reinforced composites are given as:

$$Y_{c\_random} = \frac{3Y_m}{8}\left[\frac{1 + \xi \eta_L V_f}{1 - \eta_L V_f}\right] + \frac{5Y_m}{8}\left[\frac{1 + 2\eta_T V_f}{1 - \eta_T V_f}\right] \quad (S6)$$

$$\eta_L = \frac{Y_f/Y_m - 1}{Y_f/Y_m + \xi} \quad (S7)$$

$$\eta_T = \frac{Y_f/Y_m - 1}{Y_f/Y_m + 2} \quad (S8)$$

Since there was also interest in the ratio ($R_{Halpin}$) of strength increase between aligned and randomly oriented composites (as a function of fiber loading), equation (S3) was divided by equation (S6) to yield equation (S9).

$$R_{Halpin} = \frac{Y_{c\_aligned}}{Y_{c\_random}} \quad (S9)$$

Because $Y_f \gg Y_M$, we set $\eta$ and $\eta_T$ equal to 1. Expanding and simplifying equation (S9) yields equation (S10):

$$R_{Halpin} = \frac{(1 + \xi V_f)(1 - \eta_L V_f)}{1 + 0.125 \eta_L V_f[(3\xi - 5) - V_f(3\xi + 10)]} \quad (S10)$$

Next, an analysis was undertaken to determine the same ratio of modulus increase using the rule of mixtures [equation (S11)]. The orientation efficiency factor ($\eta_0$) provided for difference between aligned ($\eta_0$=1) and randomly oriented ($\eta_0$=0.2) composites. Additionally, the length efficiency factor ($\eta_1$) could be approximated as 1 due to high SWNT aspect ratio.

$$Y_c = (\eta_0 \eta_1 Y_f - Y_m)V_f + Y_m \quad (S11)$$

Again, the ratio ($R_{Mixtures}$) of strength increase was then calculated between aligned and randomly oriented composites, by dividing equation (S11) by itself and substituting in known constants [equation (S12)], and simplifying [equation (S13)].

$$R_{Mixtures} = \frac{Y_{c\_aligned}}{Y_{c\_random}} \quad (S12)$$

$$R_{Mixtures} = \frac{(Y_f - Y_m)V_f + Y_m}{(0.2Y_f - Y_m)V_f + Y_m} \quad (S13)$$

Figure 9A:
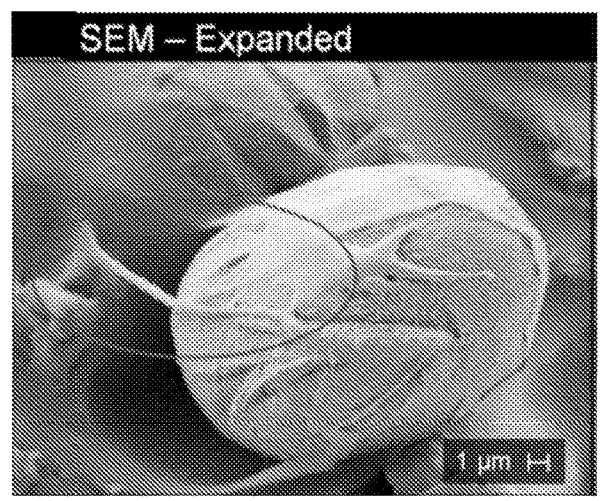
FIGS. 9A-9B are SEM images showing SWNTs imparting mechanical strength in expanded composites, where both SEM images show cross-sectional views of expanded composites (0.3 wt % SWNT, 31.2 wt % TEM), and where polymer-coated SWNTs can be seen bridging, or acting as a nanotether, between expanded TEMs and bulk polymer matrix, resulting in enhanced load transfer in expanded composites and forming the basis for increases in mechanical strength.
Figure 9B:
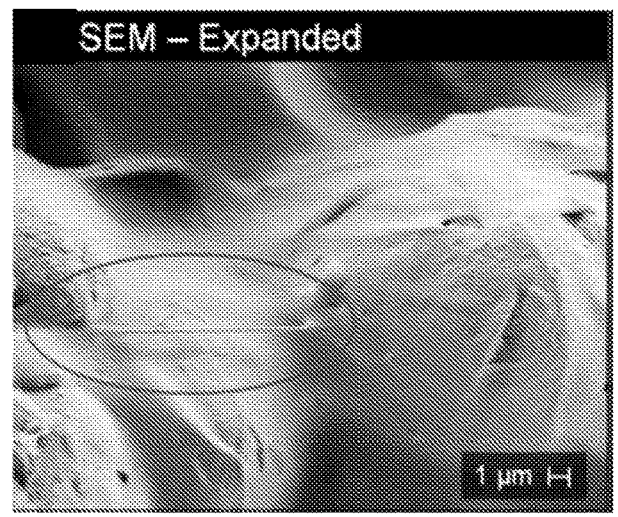

Using equations (S10) and (S13), the predicted increases in Young's modulus were examined for initial and expanded composites (FIGS. 9A-9B). The top two curves show results obtained from the rule of mixtures, while the bottom two curves show those obtained from Halpin-Tsai equations. Interestingly, based on that experimental data, the rule of mixtures predicts a larger difference between aligned and randomly oriented moduli in the initial composites, whereas Halpin-Tsai predicts this difference will be greater after the composite is expanded.

Additionally, an analysis was undertaken to develop a simple relationship to model modulus change between initial and expanded (tensioned nanotube) composites, and compare this to the two previous methods. Therefore, the ratio between percent change in expanded composite divided by percent change in the initial composite was evaluated [equation (S14)]. By including an additional value of 1 in the equation (S14), it provided the ability to predict Young's modulus of an expanded, SWNT-loaded sample [equation (S15)], and allowed for comparison to Halpin-Tsai and rule of mixtures derived ratios. Substituting in a simplifying term [β, equation (S16)] into equation (S14) and simplifying, resulted in an expansion/tensioning-induced modulus ratio [$R_{TEM}$, equation (S17)]. This equation gave the increase in modulus as a result of expansion-induced nanotube tensioning. A plot of $R_{TEM}$ on top of previously calculated Halpin-Tsai and rule of mixtures ratios was also used. While at low loadings, microsphere expansion underperformed alignment-induced strengthening (from theoretical models), the model suggested that at higher SWNT wt % (where nanotubes are able to form more of a continuous mat), expansion-induced nanotube tensioning outperformed alignment-induced strengthening predicted by Halpin-Tsai and rule of mixtures.

$$R_{TEM} = \frac{[Y_c - Y_m/Y_m]_{expanded}}{[Y_c - Y_m/Y_m]_{initial}} + 1 \quad (S14)$$

$$Y_{c\_expanded} = Y_{m\_initial} R_{TEM} \quad (S15)$$

$$\beta = Y_c/Y_m \quad (S16)$$

$$R_{TEM} = \frac{\beta_{expanded} - 1}{\beta_{initial} - 1} + 1 \quad (S17)$$

Figure 8A:
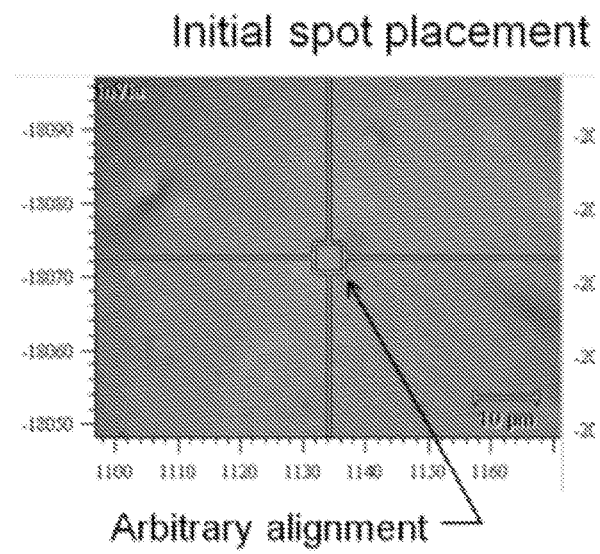
FIGS. 8A-8C include images and a graph showing Raman spot placement for initial and expanded composites, including: an image showing that on initial, unexpanded composite samples, laser alignment was arbitrary (FIG. 8A); an image showing that on expanded composites, the laser spot was placed on polymer seams between adjacent expanded microspheres (FIG. 8B); and a graph showing sample Raman spectra curves for 2D-bands of initial and expanded composite samples (0.4 wt % SWNT, 31.2 wt % TEM), where the downshift in the 2D-band of the expanded sample was due to microsphere-induced SWNT tensioning (FIG. 8C)
Figure 8B:
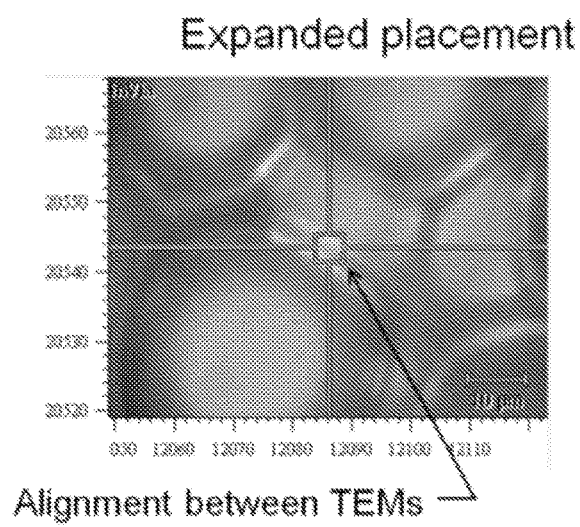
Figure 8C:
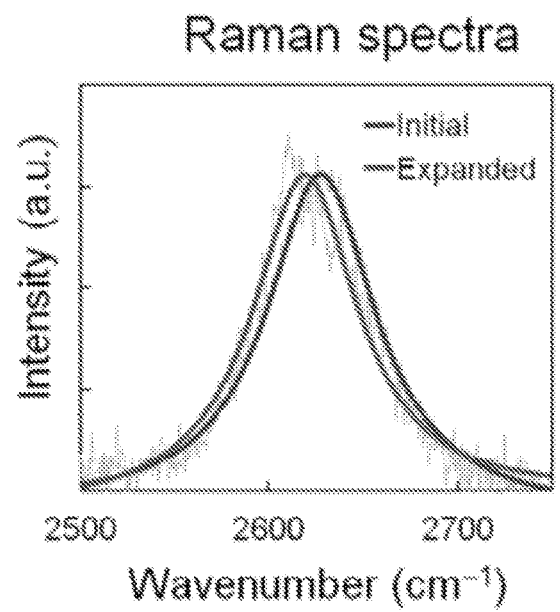

Raman spectroscopy was further utilized to verify expansion-induced SWNT tensioning and load transfer from the polymer matrix to nanotubes. Downshift in the 2D-band of SWNTs has been attributed to weakening of carbon-carbon bonds due to elongation, thereby resulting in lower vibrational frequencies. Therefore, Raman spectroscopy measurements were taken pre- and post-expansion on a 0.4 wt % SWNT, 31.2 wt % TEM composite. Prior to expansion, individual microspheres were not discernible from the surface and Raman spectra measurements (approximately 1 um spot size) were taken at arbitrary points (see FIGS. 8A-8C). For expanded composites, TEMs are clearly seen protruding; thus areas of thin polymer film between TEMs were targeted. A Lorentzian fit was used to analyze Raman data, yielding TEM expansion-induced 2D-band wavenumber downshifts of ~2.5 cm$^{-1}$. Wavenumber downshifting of the 2D-band verifies TEM expansion is stretching the polymer matrix between adjacent microspheres, and thus tensioning the SWNTs. Both Raman and SEM investigations showed SWNTs acted as nanotethers between microspheres and bulk matrix (see FIGS. 9A-9B).

Example 3

Electrical Changes Due to Shifting Nanotube Junctions

Figure 10A:
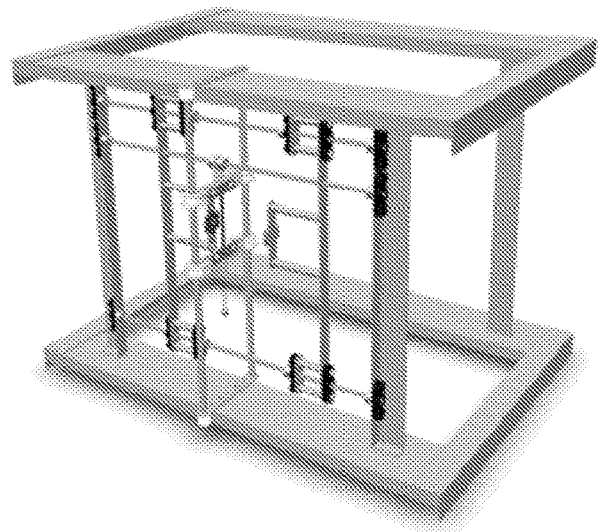
FIGS. 10A-10B include a schematic diagram and an image showing an IR-induced expansion and electrical test station constructed such that electrodes mounted to the top and bottom of each test strip recorded resistance changes in real-time, while a machine vision setup monitored expansion, including: a schematic diagram showing a model of the bench top electrical test station constructed to measure resistance changes as a function of expansion where a dual LED setup floods a composite test strip (50 mm×4 mm) with IR illumination and causes microsphere expansion (FIG. 10A); and an image showing the detail of the test station, where the upper end of a composite was mounted in a fixed position electrical connection, while the lower electrical connection assembly was free to move vertically along guide rails and allow for composite expansion and machine vision monitoring (FIG. 10B)
Figure 10B:
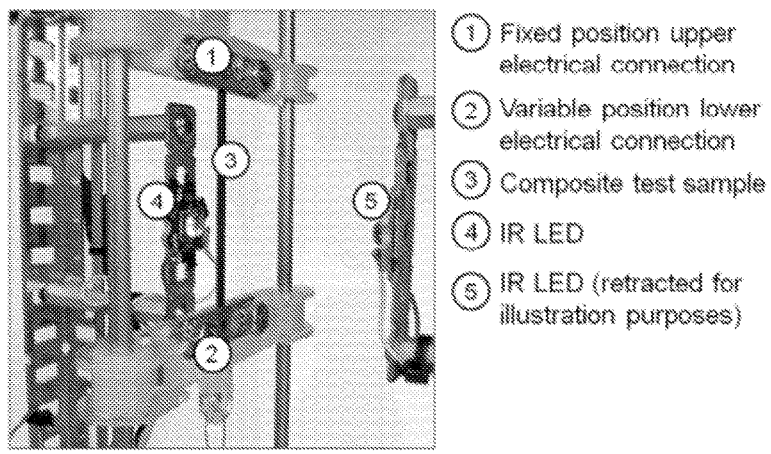

Effects of microsphere expansion were not limited solely to transformations in mechanical properties. Because of SWNTs' 1D-morphology, microsphere expansion-induced rearrangement of nanotube junctions caused corresponding electrical property shifts. IR-induced TEM expansion was used to alter amount of overlap, or electrical junctions, between adjacent SWNTs. Composite samples were exposed to 45 s of IR point source illumination [850 nm light emitting diodes (LEDs)] while continuously monitoring resistance and expansion rate (FIGS. 10A-10B). The ratio of post-expansion ($R_f$) resistance to initial ($R_0$) resistance ($R_f/R_0$) as a function of SWNT loading (represented by resistivity, $\rho$) was utilized to evaluate electrical relationships. Note that low $\rho$ resulted from high SWNT wt %, and vice versa. In all experiments, TEM loading was kept at 31.2 wt %, while SWNT ratios were varied. Intriguingly, it was found that $R_f/R_0$ exhibited four different wt % dependent electrical responses, including becoming more conductive, less conductive, transitioning from conductive to insulating, or remaining insulating.

Figure 11A:
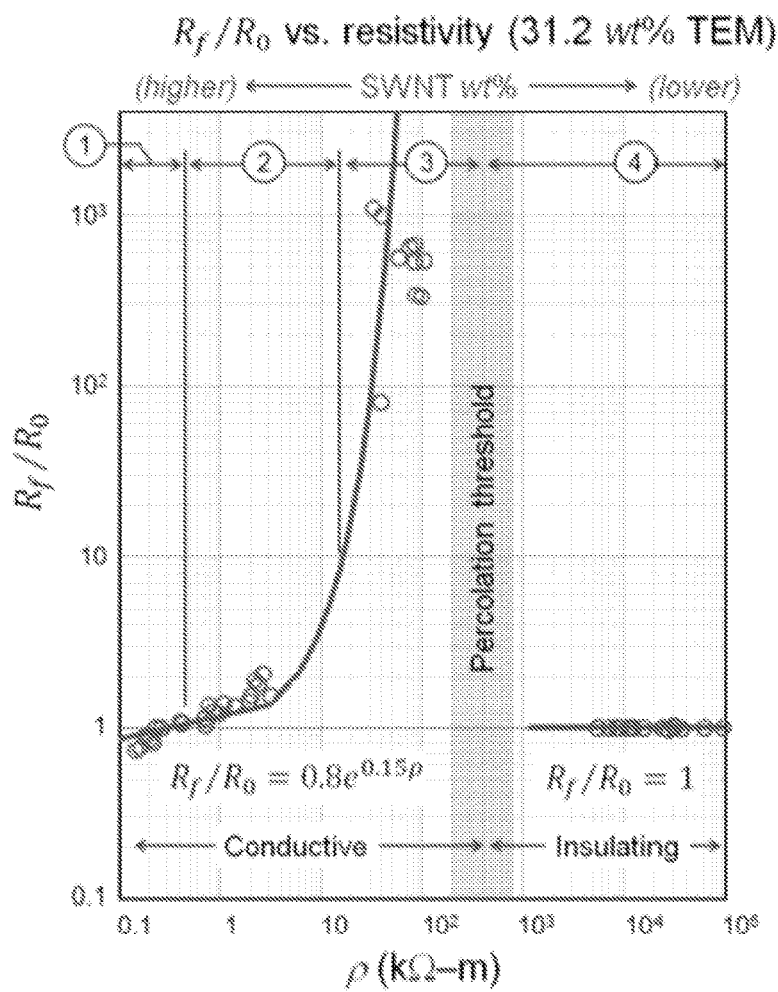
FIGS. 11A-11D are graphs showing an electrical overview and response regions of polymer composites, including a graph showing change in sample resistance ($R_f/R_0$) versus initial resistivity where response regions as well as percolation threshold are indicated on the graph (FIG. 11A); and graphs showing detail resistance changes of the first three regions versus time (FIGS. 11B-11D)

FIG. 11A is a plot showing $R_f/R_0$ versus initial sample resistivity. Near the plot center, a percolation threshold region is shown as the vertical bar; resistivities lower than that were conductive, and higher were insulating. At high wt % (low $\rho$), SWNT loading was much greater than the percolation threshold. Here (region 1), TEM expansion and subsequent nanotube junction rearrangement resulted in composites becoming more conductive ($R_f/R_0$<1). As SWNT loading lowered and $\rho$ increased (region 2), the amount of conductive overlap between adjacent nanotubes decreased as the microspheres expanded. Even after expansion, however, there was still enough nanotube contact to retain conductivity; therefore, region 2 loading resulted in samples becoming slightly more resistive and therefore less conductive (1<$R_f/R_0$<10). As SWNT loading was further lowered to just greater than the percolation threshold (region 3), microsphere expansion again stretched junctions between adjacent nanotubes. SWNT loading was low enough, however, as microspheres expanded, electrical contact between nanotubes was either broken or greatly reduced. That reduction in contact area resulted in substantial resistance increase ($R_f/R_0$>10). Expansion of those composites could be thought of as an off switch. Finally, for insulating composites where SWNT loading was less than percolation threshold (region 4), there was no observed change in electrical properties. Conductive sample data was fit to the exponential function $R_f/R_0 = 0.8e^{0.15\rho}$ while insulating data fit to $R_f/R_0 = 1$.

Figure 11B:
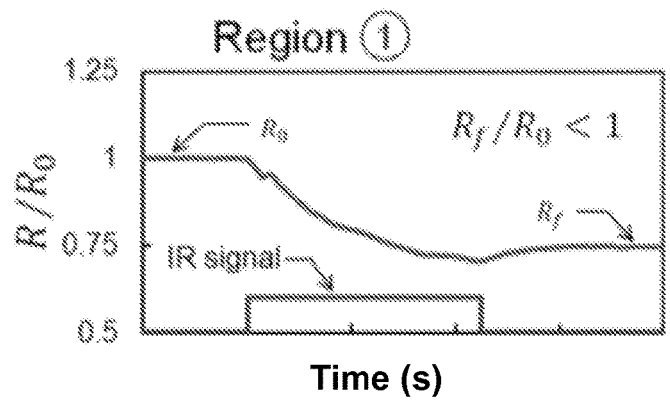
Figure 11C:
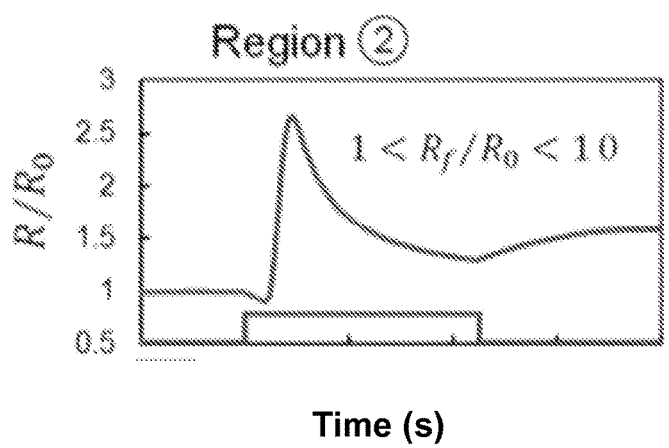
Figure 11D:
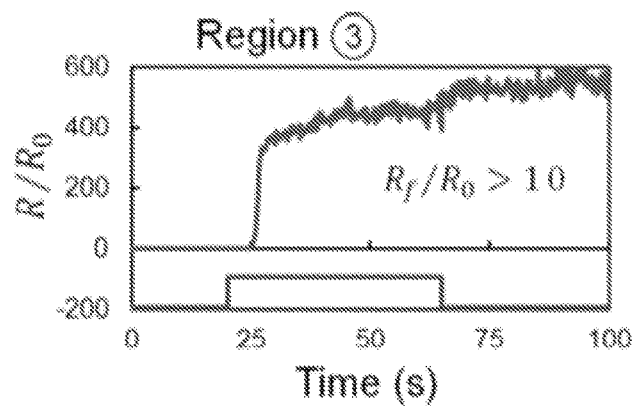

In addition to tunable $R_f/R_0$ resistance relationships, distinct time-dependent (and IR illumination-induced) resistivity patterns were observed. FIGS. 11B-11D show changes in resistance (plotted as R/R$_0$) versus time for the first three regions. Region 4 is not shown as there were no R/R$_0$ changes. Lower lines indicate IR illumination signals. Prior to IR illumination on, resistance level was steady in regions 1-3 (R/R$_0$=1). At 20 s, IR LEDs were energized. Immediately for all three regions, charge carrier generation began to occur in the conductive samples, resulting in resistance decreases (dip in R/R$_0$). Concurrently, IR-induced heating began. As the composites quickly reached microsphere expansion temperature approximately 3 s), composite dimensions started to increase in the area of IR illumination. While charge carrier generation continued to dominate, by approximately 5 s after illumination, composite expansion rate was significant enough to dictate a response. For region 1, high SWNT loading, junction stretching played a minor effect and only a slight bump up is seen before charge carrier generation continued to dominate. For region 2, SWNT loading was lower, and junction stretching caused an increase in R/R$_0$ as microsphere expansion reduced SWNT conductive overlap. As expansion reached approximately 80%, charge carrier again dominated and R/R$_0$ trend reversed. In region 3, TEM expansion caused a significant (or "open circuit" depending on wt %) reduction of nanotube junctions. Follow-on charge carrier generation effect was not observed. After IR illumination was turned off (65 s) all regions showed an increase in R/R$_0$ as e-h pairs recombined and resistance increased to an overall higher steady-state value.

Figure 12A:
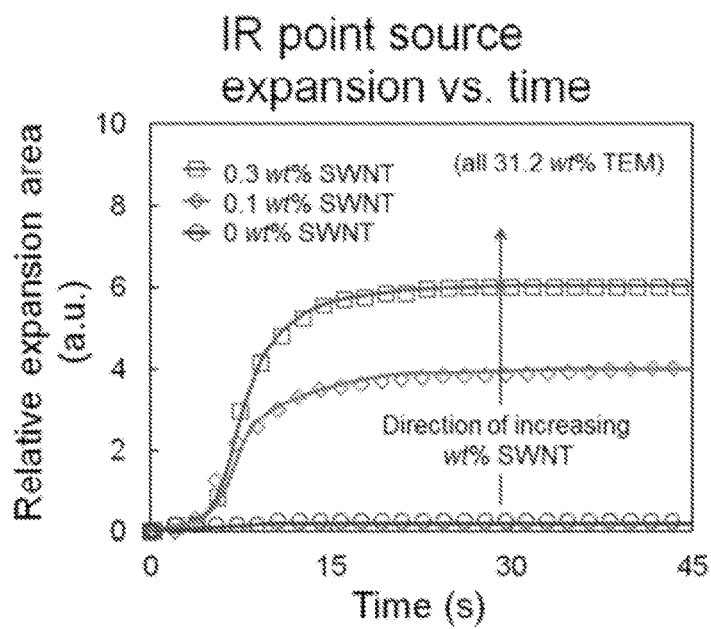
FIGS. 12A-12B include a graph and an image showing relative IR-induced expansion in various wt % SWNT composites, including a graph showing the amount of IR-induced expansion in 0, 0.1, and 0.3 wt % SWNT composite samples (all 31.2 wt % TEM), where increasing relative expansion area showed SWNTs were efficient at IR absorption and subsequent thermal transduction to polymeric chains, and where, as nanotube loading increased, increased thermal conductivity in the composites resulted in a larger expansion region (FIG. 12A); and an image showing IR-expanded composite test samples, where SWNT wt % increases are from left (no nanotubes) to right (0.3 wt % nanotubes), where all strips shown are 31.2 wt % TEM and were subjected to identical IR test conditions, and where inclusion of even a small amount of SWNTs allowed for some expansion, as is shown when comparing the 0.01 wt % (minor expansion area) to the 0 wt % (no expansion) (FIG. 12B)
Figure 12B:
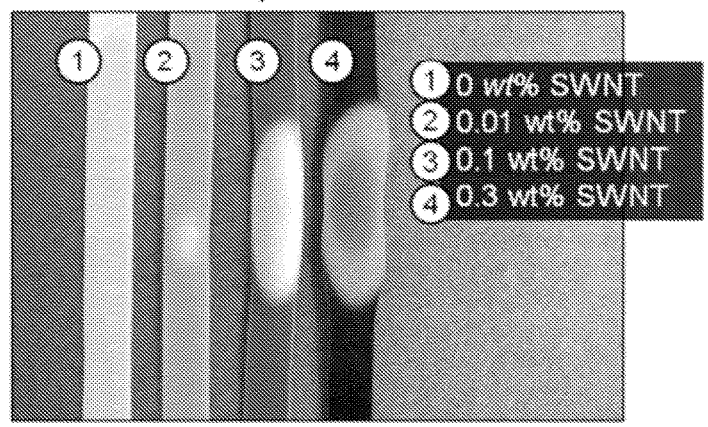

Two additional effects were observed. First, for the same IR illumination time and intensity, samples with higher SWNT wt % exhibited larger regions of microsphere expansion. This expansion indicated that associated increases in composite thermal conductivity resulted in a larger portion of the sample expanding in response to IR point source heating. More concisely, as electrical and thus thermal conductivity increased, microsphere expansion transitioned from local to global effect. Second, it was observed that the presence of nanotubes was required for a composite to exhibit IR-induced expansion as well as photon-induced resistance change. Regardless of illumination time, plain 31.2 wt % TEM samples (0 wt % SWNT) exhibited negligible expansion—indicating nanotubes were efficient at photon absorption and subsequent energy transduction, and required for IR-induced expansion (see FIGS. 12A-12B). It was remarkable that nanotubes with diameters almost three orders of magnitude smaller than the microspheres resulted in IR-induced TEM expansion. Since $R_f/R_0$ was controllable via SWNT wt %, those results could be used for creating embedded thermally actuated polymer circuits or switches with dynamically controllable electrical properties (see FIG. 13 for sample circuit design). Expansion start and stop positions can be controlled via IR modulation or selection of TEMs with either higher or lower expansion temperatures.

Figure 13A:
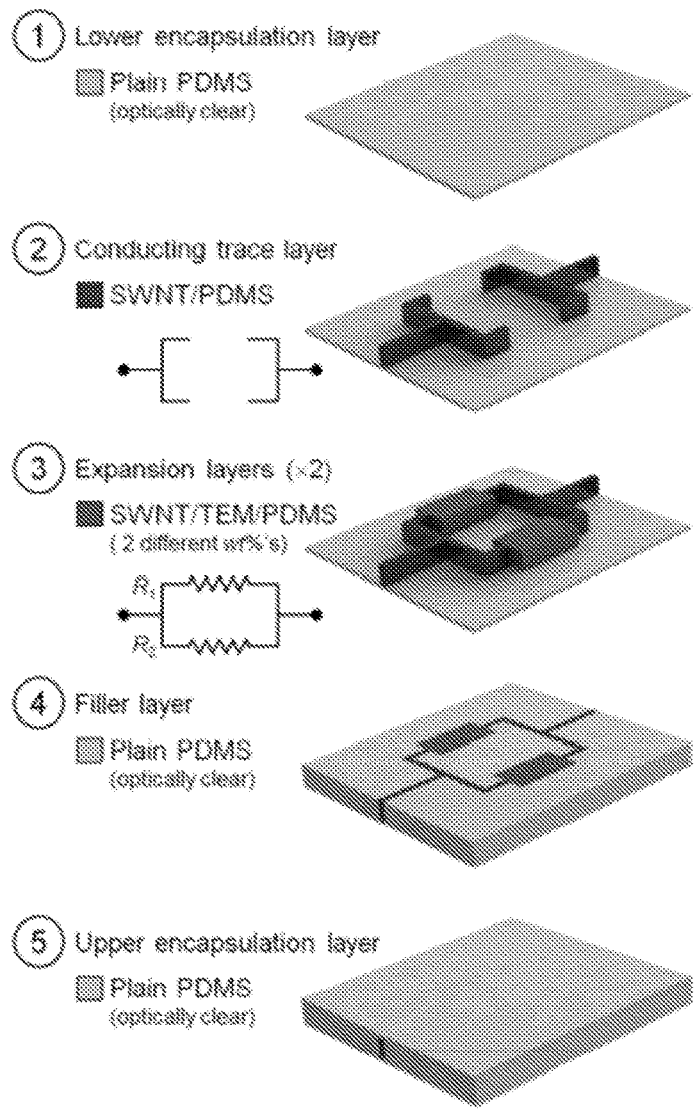
FIGS. 13A-13B include schematic diagrams showing an embedded circuit fabrication sequence required to embed a simple parallel resistor circuit into a flexible polymer skin, including: a schematic diagram showing that: in step 1, a lower encapsulation layer is deposited; in step 2, SWNT/PDMS with nanotube loading greater than the percolation threshold is deposited to form conductive traces; in step 3, two separate regions of different wt % SWNT/TEM/PDMS are patterned forming resistors $R_1$ and $R_2$ (note circuit diagram in this step as well); in step 4, a filler layer of plain PDMS is used to equalize the substrate and circuit feature height; and, in step 5, an upper encapsulation layer seals the circuit (FIG. 13A); and a schematic diagram showing a rendering of the SWNT/TEM circuit inside of its transparent plain PDMS shell (FIG. 13B).
Figure 13B:
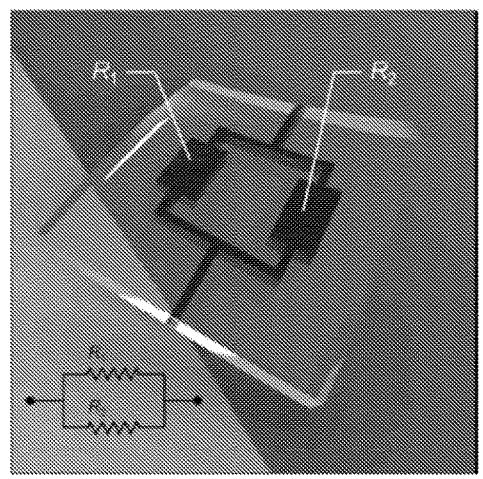

While many different combinations were possible, the following calculations showed an example of using IR-induced expansion of the embedded parallel resistor network shown in FIGS. 13A-13B to either raise, lower, or maintain total resistance. A circuit fabricated with two TEM-based resistors ($R_1$ and $R_2$) of identical microsphere wt % was assumed but different nanotube loading. Initially, total resistance of the circuit ($R_{total}$) is given by equation (S18).

$$R_{total} = \frac{R_1 R_2}{R_1 + R_2} \quad (S18)$$

Because the circuit was desired to respond as described, careful resistor selection and design was required. Based on results from FIGS. 11A-11D, $R_1$ was to be chosen with a SWNT wt % that falls into region 1, likewise $R_2$ was to be from region 2. Because region 1 selection resulted in $R_f/R_0<1$ when resistor $R_1$ (and $R_1$ only) was subjected to IR-induced expansion, $R_1$ and therefore $R_{total}$ would decrease. Similarly, since region 2 resulted in a $1<R_f/R_0<10$, IR illumination of $R_2$ (and $R_2$ only) would result in an associated rise in $R_{total}$. If both $R_1$ and $R_2$ were illuminated, the circuit could be balanced such that expansion-induced resistance changes cancelled each other out, and $R_{total}$ remained constant.

For the selection of SWNT wt %, FIGS. 11A-11D provided equation (S19), which rearranged to solve for ρ yields equation (S20).

$$R_f/R_0 = 0.8 e^{0.15\rho} \quad (S19)$$

$$\rho = \frac{1}{0.15} \ln\left(\frac{R_f}{0.8 R_0}\right) \quad (S20)$$

In order to create a balanced circuit, $R_1$ was chosen such that $R_f/R_0=0.9$ (region 1), and $R_2$ such that $R_f/R_0=1.125$ (region 2). Solving for ρ for each resistor resulted in ρ of 0.785 kΩ-m ($R_1$) and 2.273 kΩ-m ($R_2$). Equation (S21) is the ρ-wt % relationship derived from the evaporative dispersion method. Rearranging to solve for wt % yielded equation (S22).

$$\rho = 1.7 \times 10^{-5} e^{\left(\frac{2.75}{wt\% + 0.025}\right)} + 0.2 \quad (S21)$$

$$wt\% = \frac{2.75}{\ln\left(\frac{\rho - 0.2}{1.7 \times 10^{-5}}\right)} - 0.025 \quad (S22)$$

Solving for $R_1$ and $R_2$ gives loadings of 0.24 and 0.21 wt %, respectively.

With regard to designing $R_1$ and $R_2$ for a balanced circuit, when both resistors were expanded, the circuit was to maintain its original $R_{total}$. While the two resistors have different $R_f/R_0$ and thus different ρ values, to achieve a balanced response, equal original resistances were needed ($R_{10}=R_{20}$). Additionally, a constraint of equal cross-sectional areas was imposed ($A_1=A_2$). Setting $R_1$ and $R_2$ equal to each other [equation (S23)], substituting Pouillet's law [equation (S24)], and solving for a length relationship yielded equation (S25).

$$R_{10}=R_{20} \quad (S23)$$

$$\rho_1 \frac{L_1}{A} = \rho_2 \frac{L_2}{A} \quad (S24)$$

$$L_1 = 2.9 L_2 \quad (S25)$$

Therefore, resistor $R_1$ should be comprised of 0.24 wt % SWNT, 31.2 wt % TEM, and length $2.9L_2$. Resistor $R_2$ should be 0.21 wt % SWNT, 31.2 wt % TEM, and length $L_2$.

With resistor parameters determined, circuit response was evaluated upon expansion of $R_1$ only. Note that since $R_{10}=R_{20}$, initial total resistance [equation (S18)] simplified to $R_{total,0}=0.5R_0$. Additionally, because of the region 1 selection, it was known that $R_1/R_0=0.9$. Therefore $R_{1f}=0.9R_0$. Substituting this into equation (S18) and solving yielded equations (S26) and (S27):

$$R_{total,f} = \frac{(0.9R_0)R_2}{(0.9R_0) + R_2} \quad (S26)$$

$$R_{total,f}=0.47R_0 \quad (S27)$$

Since $R_{total,f}<R_{total,0}$, illumination of $R_1$ only causes a decrease in overall circuit resistance.

Similar to preceding calculations, circuit response upon expansion of $R_2$ only was also determined. Because of the region 2 selection, it was known that $R_2/R_0=1.125$, therefore $R_{2f}=1.125R_0$. Again, substituting this into equation (S18) and solving yielded equations (S28) and (S29):

$$R_{total,f} = \frac{R_1(1.125R_0)}{R_1 + (1.125R_0)} \quad (S28)$$

$$R_{total,f}=0.53R_0 \quad (S29)$$

Since $R_{total,f}>R_{total,0}$, illumination of $R_2$ only caused an increase in overall circuit resistance.

The final possible circuit response was obtained when both $R_1$ and $R_2$ were IR expanded. Substituting known values into equation (S18) and solving yielded equations (S30) and (S31):

$$R_{total,f} = \frac{(0.9R_0)(1.125R_0)}{(0.9R_0) + (1.125R_0)} \quad (S30)$$

$$R_{total,f}=0.5R_0 \quad (S31)$$

Since $R_{total,f} = R_{total,0}$, illumination of both $R_1$ and $R_2$ served to maintain overall circuit resistance.

Discussion of Examples 1-3

The above-described combination of filler materials in an elastomer matrix and resulting binary set of material properties presented a plethora of research and industrial applications. Possible applications encompassed fields such as structural health monitoring of aircraft and ships, deformable elements for flight control surfaces, deformable mirror and antennae surfaces on spacecraft, strain sensing for roads and bridges, machinery vibration control systems, and biomedical applications including micropumps and targeted drug delivery.

Figure 14A:
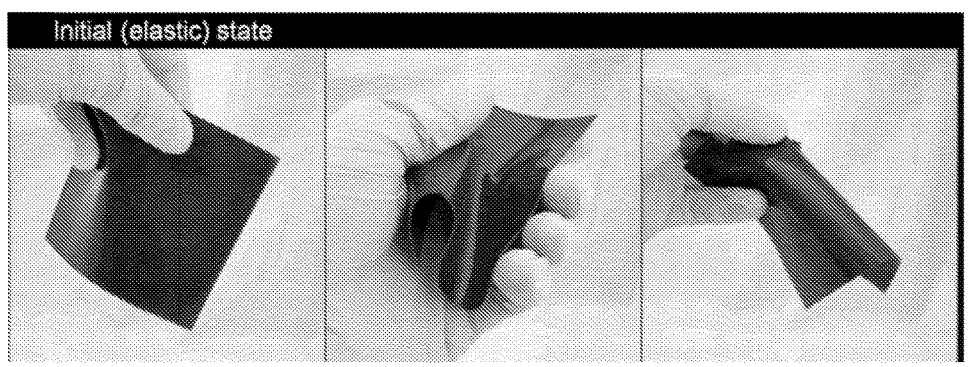
FIGS. 14A-14B include images showing an exemplary use of patterned TEM regions to serve as structural components, including: an image showing an as-fabricated polymer composite sheet shown in an elastic (unexpanded) state (FIG. 14A); and an image showing the same polymer sheet, but with expanded (plastic-like) honeycomb-patterned TEM regions (FIG. 14B)
Figure 14B:
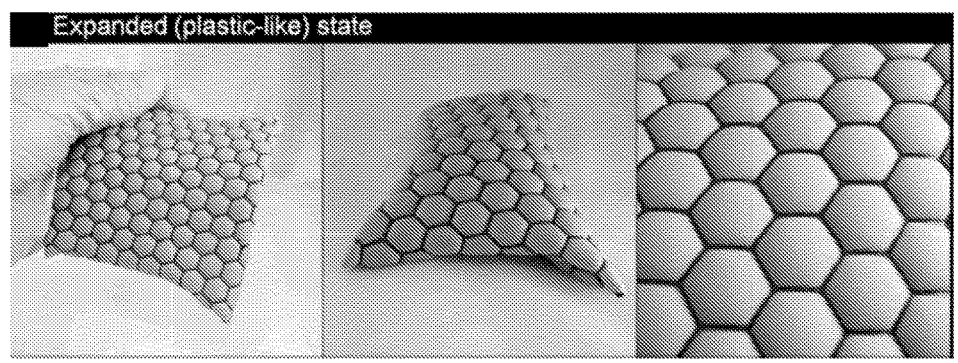
Figure 15A:
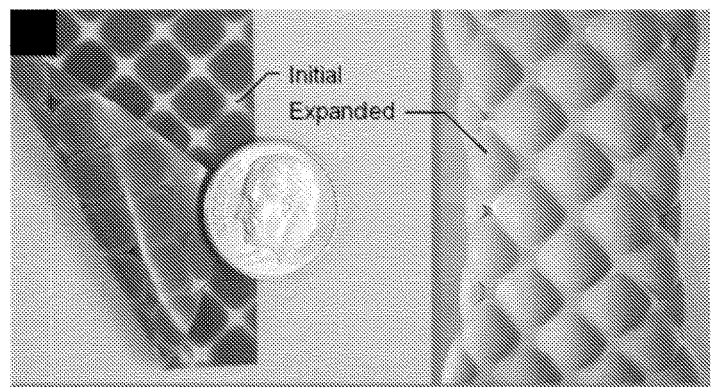
FIGS. 15A-15C include images showing assorted applications of exemplary polymer composite sheets made in accordance with the presently-disclosed subject matter, where a ternary combination of SWNTs, TEMs, and PDMS allows for the design of independently controllable regions of variable mechanical strength, electrical conductivity, and expansion in the same polymer composite, including: an image showing that thin-patterned polymer films can be incorporated into vehicle and/or equipment skins, and expanded to provide on-demand structural elements to prevent system failure (FIG. 15A); an image showing that, in biomedical applications, carbon nanostructure/TEM composites provide a possible new stent material (FIG. 15B); and an image showing that, in actuation applications, even though the TEMs cause an overall system expansion, contractive forces can still be obtained as evidenced by a thin polymer film patterned to curl up on itself, thus generating a contractive force (FIG. 15C)
Figure 15B:
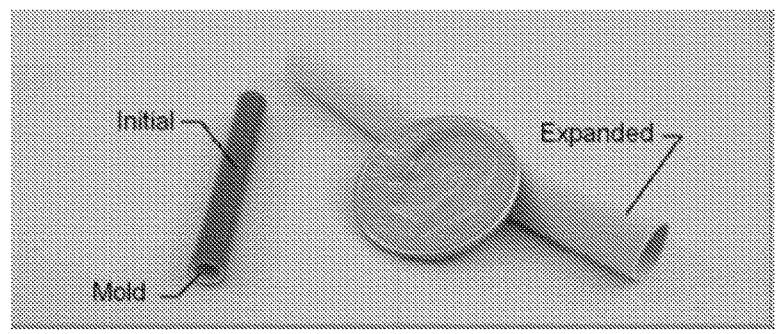
Figure 15C:
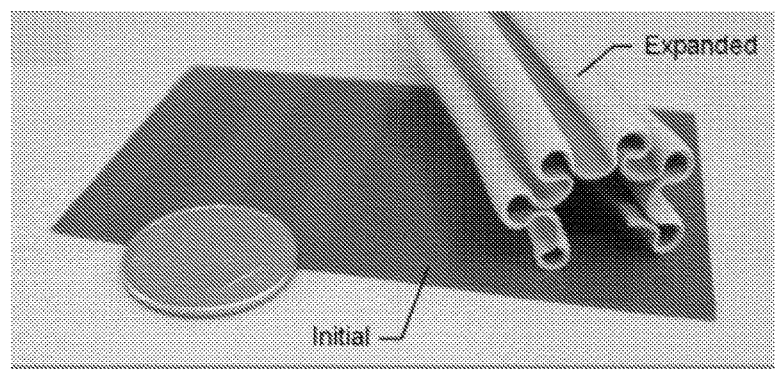
Figure 16A:
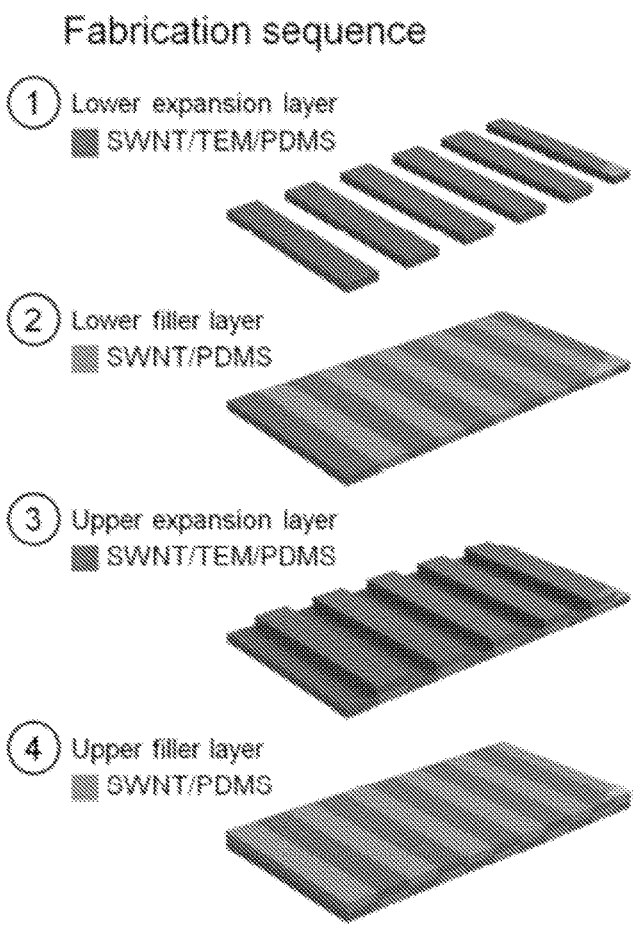
FIGS. 16A-16B include schematic diagrams showing a contracting skin fabrication sequence, including: a schematic diagram, where: first, a lower expansion layer comprised of SWNT/TEM/PDMS is patterned; second, a lower filler layer of SWNT/PDMS (no TEMs) is placed in the regions between expanding strips; third, an upper expansion layer is patterned to align on top of the lower filler layer; and, finally, an upper filler layer is deposited to duplicate curling in the opposite direction and obtain a contractive expanding response (FIG. 16A); and a schematic diagram showing resulting initial and expanded composite skins (FIG. 16B); which collectively show the polymer composites as a desired material for origami-based electrical, mechanical, and structural components.
Figure 16B:
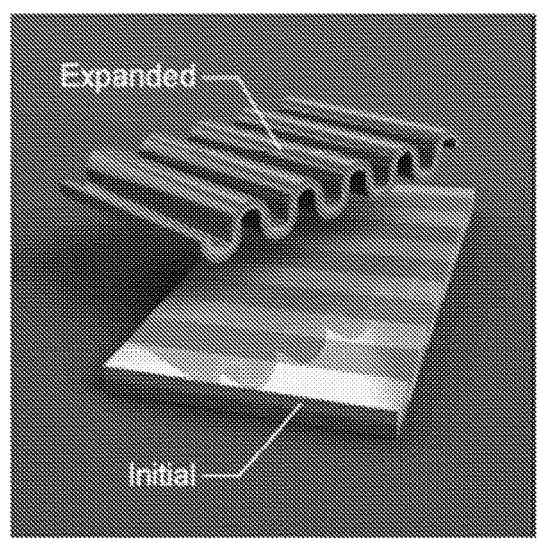

Elastic to plastic-like transformation allowed for incorporation of sensing and actuation into a single coherent functional material thereby minimizing complexity and maximizing reliability. Furthermore, benefits of IR-induced microsphere expansion included wireless actuation, electromechanical decoupling (and therefore low noise), and massive parallel actuation of device arrays from a single light source. Focused IR illumination can be used to expand a specific area or the entire composite. Ability to pattern various filler compositions into a single polymer skin allowed for a diverse set of properties (such as regions of variable expansion, conductivity, and strength) in one continuous composite, and then allowed for changes in those properties on-demand for structural and/or electrical components. For example, thin unexpanded flexible elastic polymer films can be incorporated into vehicle and/or equipment skins, and later expanded to provide on-demand structural elements preventing system failure. In biomedical applications, carbon nanostructure/TEM composites could also be used to provide a possible stent material. Although TEMs cause overall system expansion, contractive forces can be obtained through selective microsphere patterning (FIGS. 15A-15C and 16A-16B). In applications where volume is critical, such as aerospace and space travel, thin elastic polymer films can be fabricated (see, e.g., FIG. 14A) and subsequently rolled-up for shipping or launch. Once on station, these films can be expanded (FIG. 14B) to function as electrical, mechanical, and structural components.

Throughout this document, various references are mentioned. All such references are incorporated herein by reference, including the references set forth in the following list:

REFERENCES

1. H. Hanselka, Advanced Engineering Materials 2001, 3, 205.
2. A. Petersen, F M-Feinwerktech Mes 1978, 86, 304.
3. K. Uchino, M. Yoshizaki, K. Kasai, H. Yamamura, N. Sakai, H. Asakura, Nippon Seram Kyo Gak 1987, 95, 722.
4. Nagasawa, Phys Status Solidi A 1971, 8, 531.
5. K. Uchino, Am Ceram Soc Bull 1986, 65, 647.
6. T. Hirai, H. Sadatoh, T. Ueda, T. Kasazaki, Y. Kurita, M. Hirai, S. Hayashi, Angew Makromol Chem 1996, 240, 221.
7. R. Pelrine, R. Kornbluh, Q. Pei, J. Joseph, Science 2000, 287, 836.
8. W. Lehmann, H. Skupin, C. Tolksdorf, E. Gebhard, R. Zentel, P. Kruger, M. Losche, F. Kremer, Nature 2001, 410, 447.
9. R. Baughman, Makromol Chem-M Symp 1991, 51, 193.
10. P. Ajayan, O. Stephan, C. Colliex, D. Trauth, Science 1994, 265, 1212.
11. H. Koerner, G. Price, N. Pearce, M. Alexander, R. Vaia, Nature Materials 2004, 3, 115.
12. S. Ahir, E. Terentjev, Nat Mater 2005, 4, 491.
13. L. Shaoxin, B. Panchapakesan, Nanotechnology 2005, 16, 2548.
14. J. Suhr, N. Koratkar, P. Keblinski, P. Ajayan, Nature Materials 2005, 4, 134.
15. P. Miaudet, A. Derre, M. Maugey, C. Zakri, P. Piccione, R. Inoubli, P. Poulin, Science 2007, 318, 1294.
16. J. Smith, J. Connell, D. Delozier, P. Lillehei, K. Watson, Y. Lin, B. Zhou, Y. Sun, Polymer 2004, 45, 825.
17. T. Kashiwagi, F. Du, J. Douglas, K. Winey, R. Harris, J. Shields, Nature Materials 2005, 4, 928.
18. K. Chun, Y. Oh, J. Rho, J. Ahn, Y. Kim, H. Choi, S. Baik, Nat Nanotechnol 2010, 5, 853.
19. T. Fukushima, A. Kosaka, Y. Ishimura, T. Yamamoto, T. Takigawa, N. Ishii, T. Aida, Science 2003, 300, 2072.
20. H. Peng, X. Sun, F. Cai, X. Chen, Y. Zhu, G. Liao, D. Chen, Q. Li, Y. Lu, Y. Zhu, Q. Jia, Nat Nanotechnol 2009, 4, 738.
21. D. Lipomi, M. Vosgueritchian, B. Tee, S. Hellstrom, J. Lee, C. Fox, Z. Bao, Nat Nanotechnol 2011, 6, 788.
22. P. Ajayan, J. Tour, Nature 2007, 447, 1066.
23. J. Madden, Science 2007, 318, 1094.
24. B. Samel, P. Griss, G. Stemme, in IEEE International Solid-State Sensors and Actuators Conference, IEEE, New Jersey USA 2003.
25. J. Loomis, B. King, B. Panchapakesan, Appl Phys Lett 2012, 100, 073108.
26. G. Tsagaropoulos, A. Eisenburg, Macromolecules 1995, 28, 396.
27. J. Fröhlich, W. Niedermeier, H. Luginsland, Composites Part A: Applied Science and Manufacturing 2005, 36, 449.
28. J. Berriot, H. Montes, F. Lequeux, D. Long, P. Sotta, Europhysics Letters 2003, 64, 50.
29. J. Fritzsche, M. Kluppel, Journal of Physics: Condensed Matter 2011, 23, 1.
30. S. Merabia, P. Sotta, D. Long, Journal of Polymer Science, Part B: Polymer Physics 2010, 48, 1495.
31. W. Zhang, L. Shen, I. Phang, T. Liu, Macromolecules 2004, 37, 256.
32. P. Ajayan, L. Schadler, C. Giannaris, A. Rubio, Advanced Materials 2000, 12, 750.
33. J. Coleman, U. Khan, W. Blau, Y. Gun'ko, Carbon 2006, 44, 1624.
34. L. Ci, J. Suhr, V. Pushparaj, X. Zhang, P. Ajayan, Nano Lett 2008, 8, 2762.
35. S. Cronin, A. Swan, M. Ünlü, B. Goldberg, M. Dresselhaus, M Tinkham, Physical review letters 2004, 93, 167401.
36. C. Boller, Automatisierungstechnik 2006, 54, 276.
37. H. Janocha, Adaptronics and Smart Structures, Springer, 2007.
38. A. Buter, E. Breitbach, Aerospace Science and Technology 2000, 4, 309.
39. J. Durr, U. Herold-Schmidt, D. Scheulen, R. Sippel, H. Zaglauer, in Smart Structures and Materials 2000: Industrial and Commercial Applications of Smart Structures Technologies, USA 2000.
40. V. Glurgiutiu, A. Bayouml, G. Nall, Mechatronics 2002, 12, 169.
41. A. Ast, S. Braun, P. Eberhard, U. Heisel, Production Engineering 2009, 3, 207.

42. H. Van Lintel, F. Van De Pol, S. Bouwstra, Sensors and Actuators 1988, 15, 153.
43. L. Bromberg, E. Ron, Advanced Drug Delivery Reviews 1998, 31, 197.

It will be understood that various details of the presently-disclosed subject matter can be changed without departing from the scope of the subject matter disclosed herein. Furthermore, the foregoing description is for the purpose of illustration only, and not for the purpose of limitation.

What is claimed is:

1. A circuit, comprising a resistor including a plurality of carbon nanotubes, a plurality of thermally-expanding microspheres comprised of an acrylic copolymer shell encapsulating a liquid isobutane core, and an elastomeric matrix, the heat-absorbing nanomaterials and the thermally-expanding microspheres dispersed within the elastomeric matrix such that the thermally-expanding microspheres expand and stretch the matrix upon exposure to a thermal stimulus sufficient to raise the temperature of the thermally-expanding microspheres to about 100° C. to about 200° C. and for an amount of time sufficient to vaporize the liquid isobutane core.

2. The circuit of claim 1, wherein the resistor comprises a first resistor and a second resistor, the first resistor including a greater weight percentage of heat-absorbing nanomaterials than the second resistor.

3. The circuit of claim 1, wherein the carbon nanotubes are single-walled carbon nanotubes.

4. The circuit of claim 1, wherein the acrylic copolymer shell comprises poly(vinylidene chloride-co-acrylonitrile-co-methyl methacrylate).

5. The circuit of claim 1, wherein the thermally-expanding microspheres have a diameter of about 5 µm to about 10 µm prior to exposure to the thermal stimulus and a diameter of about 10 µm to about 20 µm subsequent to exposure to the thermal stimulus.

6. The circuit of claim 1, wherein the elastomeric matrix is comprised of polydimethylsiloxane.

* * * * *